United States Patent
Hashimoto et al.

(10) Patent No.: US 12,045,037 B2
(45) Date of Patent: *Jul. 23, 2024

(54) SUBSTRATE PROCESSING APPARATUS, SUBSTRATE PROCESSING SYSTEM, AND SUBSTRATE PROCESSING METHOD

(71) Applicant: SCREEN Holdings Co., Ltd., Kyoto (JP)

(72) Inventors: Koji Hashimoto, Kyoto (JP); Shinji Shimizu, Kyoto (JP); Hiroshi Horiguchi, Kyoto (JP); Masahiro Yamamoto, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/463,210

(22) Filed: Sep. 7, 2023

(65) Prior Publication Data
US 2023/0418267 A1    Dec. 28, 2023

Related U.S. Application Data

(63) Continuation of application No. 17/269,560, filed as application No. PCT/JP2019/035229 on Sep. 6, 2019, now Pat. No. 11,822,318.

(30) Foreign Application Priority Data

Sep. 20, 2018 (JP) ................... 2018-176482

(51) Int. Cl.
*G05B 19/418* (2006.01)
*H01L 21/02* (2006.01)
*H01L 21/306* (2006.01)

(52) U.S. Cl.
CPC .. *G05B 19/418* (2013.01); *G05B 2219/45031* (2013.01); *G05B 2219/45212* (2013.01); *H01L 21/02057* (2013.01); *H01L 21/30604* (2013.01)

(58) Field of Classification Search
CPC ............ G05B 19/418; G05B 19/41865; G05B 2219/45031; G05B 2219/45212;
(Continued)

(56) References Cited

U.S. PATENT DOCUMENTS

2002/0053321 A1    5/2002    Tomita et al.
2003/0119318 A1*   6/2003    Niuya ............... H01L 21/31133
                                                         257/E21.228
(Continued)

FOREIGN PATENT DOCUMENTS

JP    2004-025057 A    1/2004
JP    2007-123734 A    5/2007
(Continued)

OTHER PUBLICATIONS

Notice of Decision to Grant dated May 8, 2023 in corresponding Korean Patent Application No. 10-2021-7007442.
(Continued)

*Primary Examiner* — Kidest Bahta
(74) *Attorney, Agent, or Firm* — OSTROLENK FABER LLP

(57) ABSTRACT

It is an object of the present invention to reduce the amount of data used in an apparatus, a system, and a method for performing a substrate processing. In order to achieve this object, a substrate processing apparatus includes one or more processing units each for performing a processing on a substrate and one or more arithmetic processing parts. One or more arithmetic processing parts generate a flow recipe defining a flow of a series of processings for a substrate by combining two or more processing recipes among a plurality
(Continued)

of processing recipes each defining a processing condition relating to a processing to be performed on a substrate in the one or more processing units. The plurality of processing recipes include a plurality of liquid processing recipes each defining a condition of a processing to be performed on a substrate by using a processing liquid.

6 Claims, 20 Drawing Sheets

(58) Field of Classification Search
CPC .... G05B 11/00; G05B 19/4181; G05B 23/00; H01L 21/02057; H01L 21/30604; H01L 21/67051; H01L 21/6708; H01L 21/67253; H01L 21/67276; Y02P 90/02
See application file for complete search history.

(56) References Cited

U.S. PATENT DOCUMENTS

| | | | |
|---|---|---|---|
| 2004/0200574 A1 | 10/2004 | Davis | |
| 2010/0198386 A1* | 8/2010 | Yamaji | H01L 22/12 700/110 |
| 2011/0206486 A1 | 8/2011 | Matsuyama et al. | |
| 2012/0096006 A1 | 4/2012 | David et al. | |
| 2015/0220136 A1 | 8/2015 | Yuasa | |
| 2016/0027707 A1* | 1/2016 | Ryu | H01L 22/12 438/7 |
| 2016/0329224 A1 | 11/2016 | Yamamoto | |
| 2017/0040177 A1 | 2/2017 | Sasaki et al. | |
| 2017/0176983 A1 | 6/2017 | Tetiker et al. | |
| 2017/0287750 A1 | 10/2017 | Amano et al. | |
| 2018/0047576 A1 | 2/2018 | Takahashi et al. | |
| 2018/0107637 A1 | 4/2018 | Sugawara et al. | |

FOREIGN PATENT DOCUMENTS

| | | |
|---|---|---|
| JP | 2011-077243 A | 4/2011 |
| JP | 2018-067626 A | 4/2018 |
| KR | 10-2002-0035439 A | 5/2002 |
| KR | 10-2016-0108547 A | 9/2016 |
| KR | 10-2017-0004951 A | 1/2017 |
| TW | 201142553 A1 | 12/2011 |
| TW | 201232649 A | 8/2012 |
| TW | 201535564 A | 9/2015 |
| TW | 201734684 A | 10/2017 |
| TW | 201802918 A | 1/2018 |

OTHER PUBLICATIONS

Notice of Decision to Grant with Search Report dated May 19, 2023 in corresponding Taiwanese Patent Application No. 110137099.
Office Action dated May 20, 2022 in corresponding Taiwanese Patent Application No. 110137099 with partial English translation based on the Japanese translation.
International Search Report mailed Oct. 29, 2019 in corresponding PCT International Application No. PCT/JP2019/035229.
Written Opinion mailed Oct. 29, 2019 in corresponding PCT International Application No. PCT/JP2019/035229.
Japanese Decision of Refusal dated Sep. 27, 2022 in corresponding Japanese Patent Application No. 2018-176482 and a computer generated English translation obtained from the JPO.
Office Action and Search Report dated Feb. 20, 2021 in corresponding Taiwanese Patent Application No. 108128835 with English translation based on attached Japanese translation. Portions relevant to prior-art based rejections are translated.
Request for the Submission of an Opinion dated Aug. 17, 2022 in corresponding Korean Patent Application No. 10-2021-7007442 and computer generated English translation obtained from the JPO.
Notice of Final Rejection dated Feb. 9, 2023 in corresponding Korean Patent Application No. 10-2021-7007442 and a computer generated English translation obtained from the JPO.
Notice of Reasons for Refusal dated Jul. 5, 2022 in corresponding Japanese Patent Application No. 2018-176482 with computer generated English translation obtained from the JPO.
Office Action and Search Report dated Jan. 13, 2022 in corresponding Taiwanese Patent Application No. 110137099 with partial English translation based on the Japanese translation.
International Preliminary Report on Patentability and Written Opinion dated Apr. 1, 2021 in corresponding International Application No. PCT/JP2019/035229 with English translation.
Notice of Decision to Grant dated Dec. 7, 2023 in corresponding Korean Patent Application No. 10-2023-7021635.

\* cited by examiner

F I G. 5
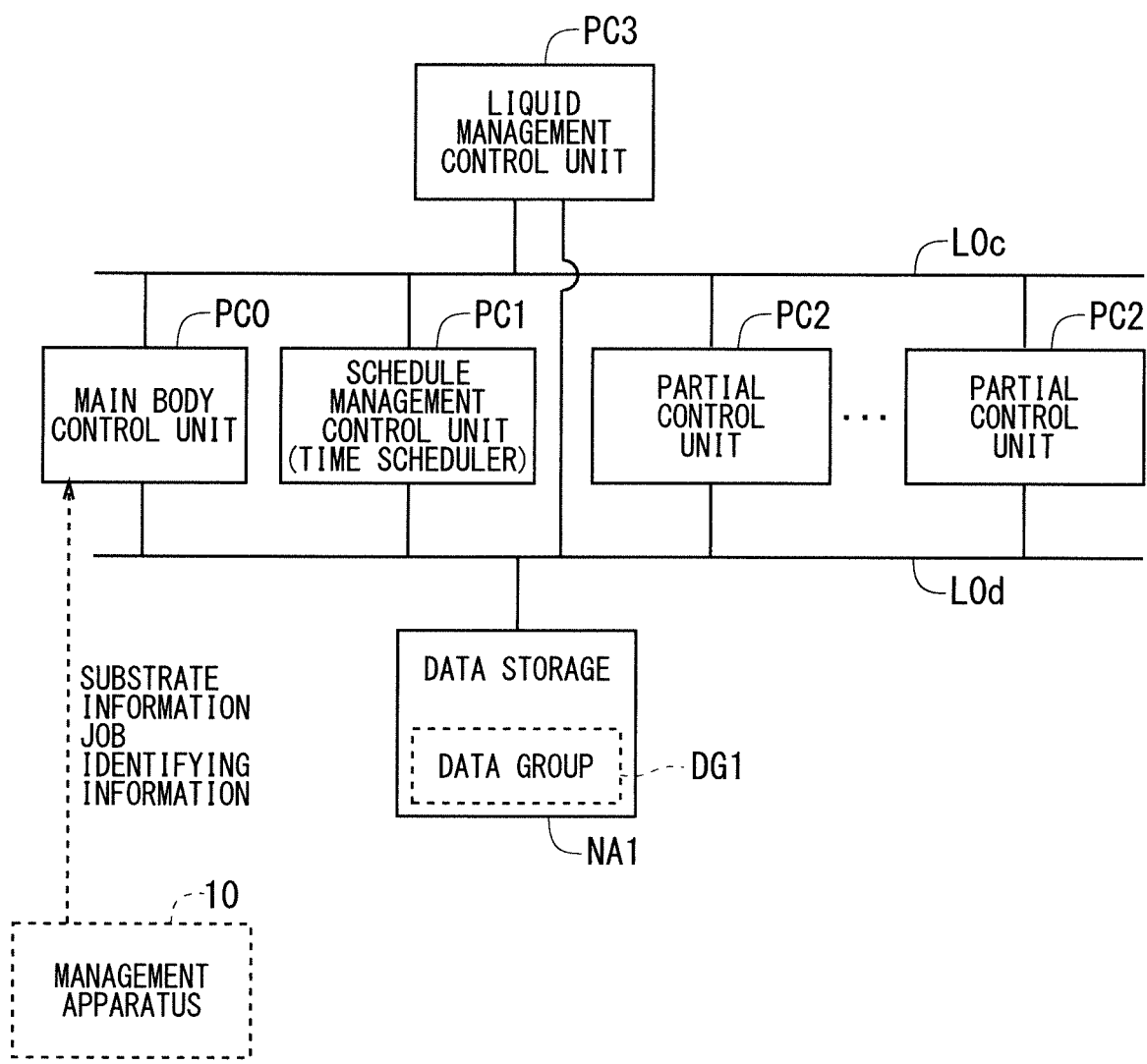

F I G. 19
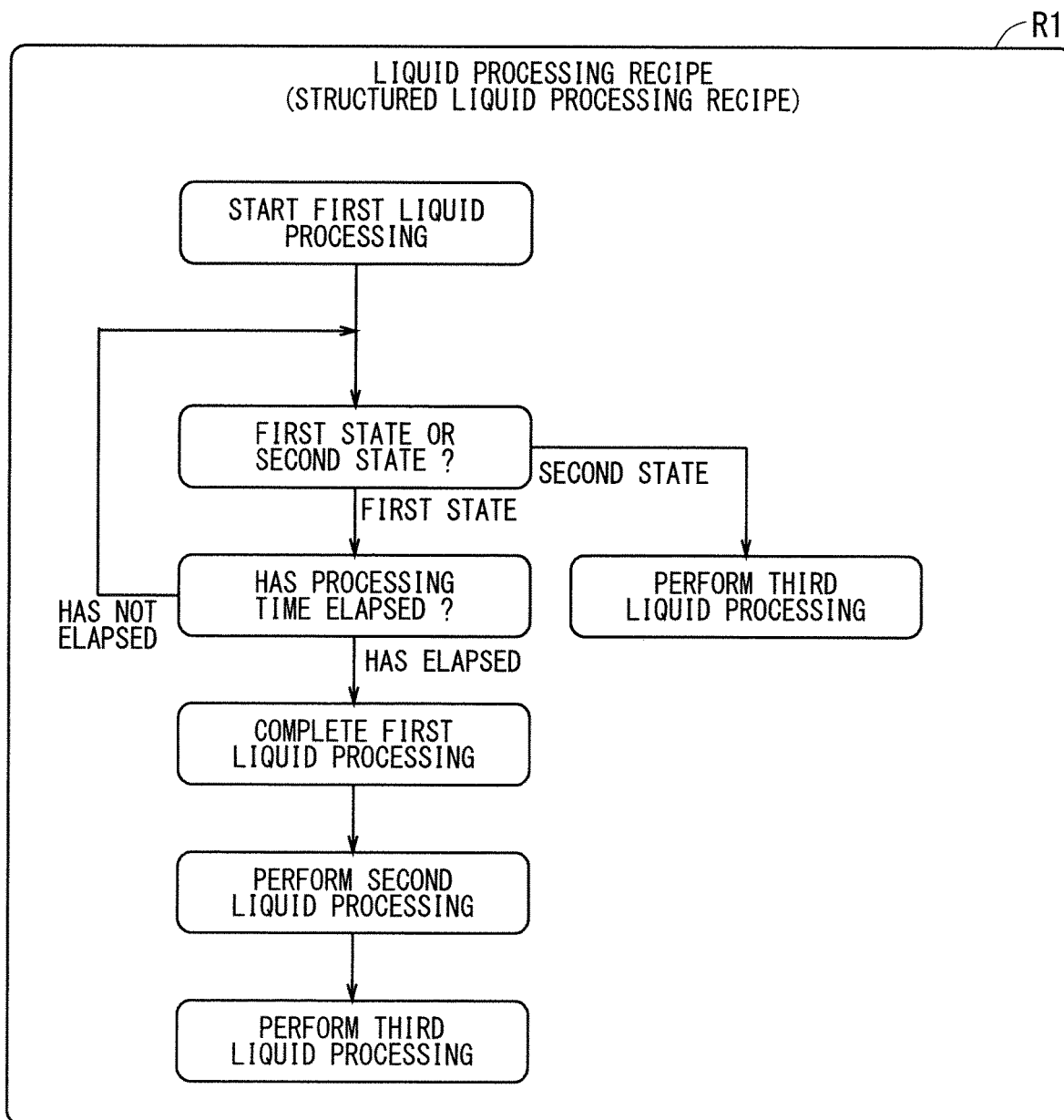

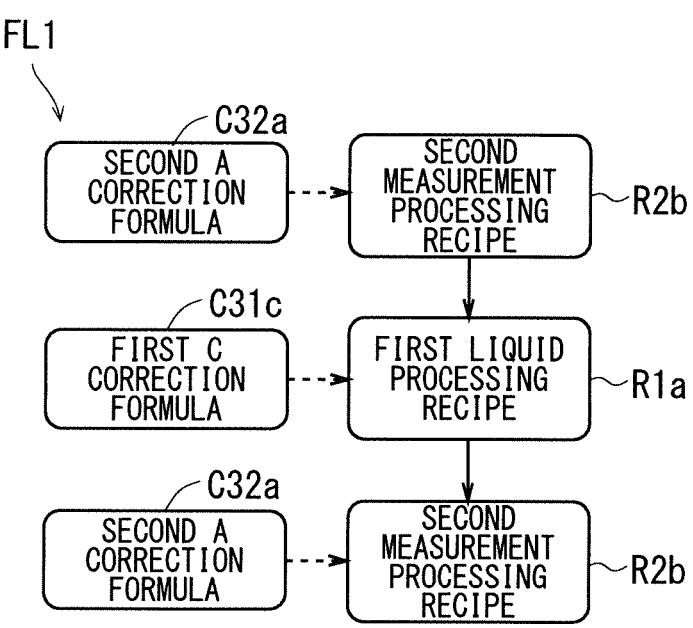
F I G. 2 0

SUBSTRATE PROCESSING APPARATUS, SUBSTRATE PROCESSING SYSTEM, AND SUBSTRATE PROCESSING METHOD

CROSS-REFERENCE TO RELATED APPLICATIONS

The present application is a continuation of prior U.S. patent application Ser. No. 17/269,560, filed Feb. 19, 2021, by Koji HASHIMOTO, Shinji SHIMIZU, Hiroshi HORIGUCHI and Masahiro YAMAMOTO, entitled "SUBSTRATE PROCESSING APPARATUS, SUBSTRATE PROCESSING SYSTEM, AND SUBSTRATE PROCESSING METHOD," which is a 35 U.S.C. §§ 371 national phase conversion of International Application No. PCT/JP2019/035229, filed Sep. 6, 2019, which claims priority to Japanese Patent Application No. 2018-176482, filed Sep. 20, 2018, the contents of both of which are incorporated herein by reference. The PCT International Application was published in the Japanese language. The contents of each of the patent applications listed above are incorporated in full herein by reference.

TECHNICAL FIELD

The present invention relates to a substrate processing apparatus, a substrate processing system, and a substrate processing method. Substrates to be processed include, for example, semiconductor substrates, substrates for liquid crystal display device, substrates for flat panel display such as an organic EL (Electroluminescence) display, substrates for optical disk, substrates for magnetic disk, substrates for magneto-optic disk, substrates for photomask, ceramic substrates, substrates for solar battery, and the like.

BACKGROUND ART

There is a substrate processing apparatus including a plurality of processing units capable of performing various processings such as cleaning, etching, and the like of a substrate by using a processing liquid such as a chemical liquid or the like.

Further, there is a substrate processing system including a plurality of substrate processing apparatuses and a group controller as a management computer connected to the plurality of substrate processing apparatuses via a communication line (see, for example, Patent Document 1 and the like). This group controller, for example, stores information (also referred to as process-related information) on processings of substrates such as a recipe and a parameter used for controlling each of the substrate processing apparatuses into a storage part and performs comparison of a plurality of pieces of process-related information, manual editing thereof, and transmission of the process-related information to the substrate processing apparatuses.

PRIOR ART DOCUMENTS

Patent Documents

[Patent Document 1] Japanese Patent Application Laid Open Gazette No. 2018-67626

SUMMARY

Problem to be Solved by the Invention

For the management computer, for example, as conditions of processings on substrates in the substrate processing apparatus increase, it is necessary to prepare more pieces of information including flow recipes defining a series of processings to be performed on substrates in the substrate processing apparatus. For this reason, for example, the amount of data which are stored and managed in the management computer and the amount of data to be transmitted from the management computer to the substrate processing apparatus can increase. It is thereby required to increase the storage capacity of the storage part in the management computer, increase the speed of transmission to the substrate processing apparatus, and the like.

Therefore, in the substrate processing apparatus, the substrate processing system, and the substrate processing method, there is room for improvement in reducing the amount of data to be used therein.

The present invention is intended to solve the above problem, and it is an object of the present invention to provide a substrate processing apparatus, a substrate processing system, and a substrate processing method capable of reducing the amount of data to be used.

Means to Solve the Problem

To solve the above-described problem, the substrate processing apparatus according to a first aspect includes one or more processing units each for performing a processing on a substrate and one or more arithmetic processing parts. The one or more arithmetic processing parts generate a flow recipe defining a flow of a series of processings for a substrate by combining two or more processing recipes among a plurality of processing recipes each defining a processing condition relating to a processing to be performed on a substrate in the one or more processing units. The plurality of processing recipes include a plurality of liquid processing recipes each defining a condition of a processing to be performed on a substrate by using a processing liquid.

The substrate processing apparatus according to a second aspect is the substrate processing apparatus according to the first aspect, and further includes one or more sensor parts each for acquiring a signal relating to an index on a state of a substrate processing in the one or more processing units. The plurality of processing recipes include a plurality of measurement processing recipes each defining a condition of a measurement processing performed by the one or more sensor parts for acquiring the signal relating to the index. The one or more arithmetic processing parts generate the flow recipe by combining one or more liquid processing recipes among the plurality of liquid processing recipes and one or more measurement processing recipes among the plurality of measurement processing recipes.

The substrate processing apparatus according to a third aspect is the substrate processing apparatus according to the second aspect, and the one or more arithmetic processing parts generate the flow recipe by combining at least one processing recipe among the two or more processing recipes with at least one correction formula among a plurality of correction formulas for correcting at least part of conditions of the plurality of processing recipes on the basis of the signal relating to the index acquired by the one or more sensor parts. The one or more arithmetic processing parts calculate one or more correction coefficients from the at least one correction formula in response to the signal relating to the index acquired by the one or more sensor parts and correct a condition defined by the at least one processing recipe with the one or more correction coefficients.

The substrate processing apparatus according to a fourth aspect is the substrate processing apparatus according to the second or third aspect, and the one or more sensor parts acquires a signal relating to one or more kinds of indices indicating a state of a substrate. The plurality of processing recipes include a first processing recipe and a second processing recipe. The plurality of measurement processing recipes include a first measurement processing recipe defining a condition of a measurement processing performed by the one or more sensor parts for acquiring the signal relating to the one or more kinds of indices. The one or more arithmetic processing parts generate the flow recipe by combining the first measurement processing recipe and one branch processing recipe, among a plurality of branch processing recipes each for branching a processing flow, which defines a condition of a branch processing for causing a first after-branch processing flow to be performed when the one or more kinds of indices satisfy a first condition and causing a second after-branch processing flow to be performed when the one or more kinds of indices satisfy a second condition while combining the one branch processing recipe with the first processing recipe as a processing recipe of the first after-branch processing flow and combining the one branch processing recipe with the second processing recipe as a processing recipe of the second after-branch processing flow.

The substrate processing apparatus according to a fifth aspect is the substrate processing apparatus according to any one of the first to fourth aspects, and the plurality of liquid processing recipes include one or more structured liquid processing recipes which each define a processing flow and a condition, in which if it is in a first state while a processing using a first processing liquid is performed on a substrate, a processing using a second processing liquid is performed on the substrate after the processing using the first processing liquid, or in response to the change of the first state to a second state, which is made while the processing using the first processing liquid is performed on the substrate, a processing using a third processing liquid is performed on the substrate.

A substrate processing system according to a sixth aspect includes a plurality of substrate processing apparatuses and a management apparatus connected to the plurality of substrate processing apparatuses so as to be capable of transmitting and receiving data. The management apparatus includes a first communication part for transmitting and receiving information to/from each of the plurality of substrate processing apparatuses. Each of the plurality of substrate processing apparatuses includes one or more processing units each for performing a processing on a substrate, a second communication part for transmitting and receiving information to/from the management apparatus, and one or more arithmetic processing parts for generating a flow recipe defining a flow of a series of processings for a substrate. At least part of the plurality of substrate processing apparatuses and the management apparatus includes one or more storage parts for storing a plurality of processing recipes each defining a processing condition relating to a processing to be performed on a substrate in the one or more processing units. The plurality of processing recipes include a plurality of liquid processing recipes each defining a condition of a processing to be performed on a substrate by using a processing liquid. The first communication part transmits two or more pieces of identifying information identifying two or more processing recipes respectively to each of the plurality of substrate processing apparatuses. The second communication part receives the two or more pieces of identifying information. The one or more arithmetic processing parts generate the flow recipe by combining the two or more processing recipes among the plurality of processing recipes on the basis of the two or more pieces of identifying information.

The substrate processing system according to a seventh aspect is the substrate processing system according to the sixth aspect, and each of the plurality of substrate processing apparatuses includes one or more sensor parts each for acquiring a signal relating to an index on a state of a substrate processing in the one or more processing units. The plurality of processing recipes include a plurality of measurement processing recipes each defining a condition of a measurement processing performed by the one or more sensor parts for acquiring the signal relating to the index. The one or more storage parts store a plurality of correction formulas for correcting at least part of conditions of the plurality of processing recipes on the basis of the signal relating to the index acquired by the one or more sensor parts. The one or more arithmetic processing parts generate the flow recipe by combining the two or more processing recipes including one or more liquid processing recipes among the plurality of liquid processing recipes and one or more measurement processing recipes among the plurality of measurement processing recipes and combining at least one processing recipe among the two or more processing recipes with at least one correction formula among the plurality of correction formulas. The one or more processing units perform a processing on a substrate in accordance with the flow recipe. The one or more sensor parts acquire a single relating to one or more kinds of indices indicating a state of a substrate. The one or more arithmetic processing parts cause the second communication part to transmit information to the management apparatus, the information indicating a combination of the at least one processing recipe and the at least one correction formula in the flow recipe, in a case where the signal relating to the one or more kinds of indices acquired by the one or more sensor parts satisfies a predetermined condition when the one or more processing units perform a processing on a substrate in accordance with the flow recipe.

A substrate processing method according to eighth aspect is a substrate processing method using a substrate processing apparatus which includes one or more processing units each performing a processing on a substrate and one or more arithmetic processing parts, and includes steps (a), (b), and (c). In the step (a), one or more storage parts store a plurality of processing recipes each defining a processing condition relating to a processing to be performed on a substrate in the one or more processing units. In the step (b), the one or more arithmetic processing parts generate a flow recipe defining a flow of a series of processings for a substrate by combining two or more processing recipes among the plurality of processing recipes stored in the one or more storage parts in the step (a). In the step (c), the one or more processing units perform a processing in accordance with the flow recipe generated in the step (b). The plurality of processing recipes include a plurality of liquid processing recipes each defining a condition of a processing to be performed on a substrate by using a processing liquid.

Effects of the Invention

According to the substrate processing apparatus of the first aspect, for example, even if the conditions of the series of processings to be performed on the substrate increase, the flow recipe can be generated by combining two or more processing recipes among the plurality of processing recipes which are prepared in advance, instead of increasing the number of flow recipes which are prepared in advance. It is thereby possible, for example, to reduce the amount of data which are prepared in advance in the substrate processing apparatus or the like. As a result, for example, it is possible to reduce the amount of data to be used in the substrate processing apparatus.

According to the substrate processing apparatus of the second aspect, for example, it is possible to generate the flow recipe by combining two or more processing recipes among the plurality of processing recipes including not only the processing using a processing liquid but also the processing in which the measurement is performed. Even if the conditions of the series of processings including the measurement processing to be performed on the substrate increase, for example, the flow recipe can be thereby generated by combining two or more processing recipes among the plurality of processing recipes which are prepared in advance, instead of increasing the number of flow recipes which are prepared in advance. As a result, it is possible, for example, to reduce the amount of data to be used in the substrate processing apparatus.

According to the substrate processing apparatus of the third aspect, for example, it is possible to generate the flow recipe by combining the processing recipe with the correction formula. Even if the conditions of the series of processings including the correction of the processing to be performed on the substrate increase, for example, the flow recipe can be thereby generated by combining two or more processing recipes among the plurality of processing recipes which are prepared in advance and combining at least one correction formula among the plurality of correction formulas which are prepared in advance with at least one processing recipe, instead of increasing the number of flow recipes which are prepared in advance. As a result, for example, it is possible to reduce the amount of data to be used in the substrate processing apparatus.

According to the substrate processing apparatus of the fourth aspect, for example, it is possible to generate the flow recipe for performing a series of processings in accordance with the state of the substrate by combining the first measurement processing recipe, the branch processing recipe, the first processing recipe relating to the first after-branch processing flow, and the second processing recipe relating to the second after-branch processing flow. Even if the conditions of the series of processings to be performed on the substrate increase so that the processing flow branches in accordance with the state of the substrate, for example, the flow recipe defining the series of processings on the substrate so that the state of the substrate may approximate a desired state can be thereby generated by combining the first measurement processing recipe among the plurality of measurement processing recipes which are prepared in advance, one branch processing recipe among the plurality of branch processing recipes which are prepared in advance, and the first liquid processing recipe and the second liquid processing recipe among the plurality of liquid processing recipes which are prepared in advance. As a result, it is possible, for example, to reduce the amount of data which are prepared in advance in the substrate processing apparatus or the like and reduce the amount of data to be used in the substrate processing apparatus. Further, as compared with a case where the processing is performed again on the substrate in the substrate processing apparatus in order to make the substrate approximate to the desired state after the substrate is unloaded from the substrate processing apparatus, for example, it is possible to easily increase the efficiency of the processing performed on the substrate.

According to the substrate processing apparatus of the fifth aspect, for example, in a case where the processing using the first processing liquid and the processing using the second processing liquid are sequentially performed on the substrate, if it is brought into a specific state while the processing using the first processing liquid is performed on the substrate, a processing using a third processing liquid can be performed on the substrate after finishing the processing using the first processing liquid. It is thereby possible, for example, to perform an appropriate processing according to the situation at the time when the processing using the first processing liquid is performed on the substrate.

According to the substrate processing system of the sixth aspect, for example, even if the conditions of the series of processings to be performed on the substrate increase, the substrate processing apparatus can generate the flow recipe by combining two or more processing recipes corresponding to two or more pieces of identifying information from the management apparatus among the plurality of processing recipes which are prepared in advance, instead of increasing the number of flow recipes which are prepared in advance. It is thereby possible, for example, to reduce the amount of data which are prepared in advance in the substrate processing system. As a result, for example, it is possible to reduce the amount of data to be used in the substrate processing system.

According to the substrate processing system of the seventh aspect, for example, in a case or the like, where the processing based on the processing recipe combined with the correction formula produces an excellent result, the information indicating the combination of the processing recipe and the correction formula can be transmitted to the management apparatus. It thereby becomes possible to use the combination of the processing recipe and the correction formula, which produces an excellent result, also in another substrate processing apparatus.

According to the substrate processing method of the eighth aspect, for example, even if the conditions of the series of processings to be performed on the substrate increase, the flow recipe can be generated by combining two or more processing recipes among the plurality of processing recipes which are prepared in advance, instead of increasing the number of flow recipes which are prepared in advance. It is thereby possible, for example, to reduce the amount of data which are prepared in advance. As a result, for example, it is possible to reduce the amount of data to be used for performing the substrate processing.

BRIEF DESCRIPTION OF DRAWINGS

FIG. 5 is a block diagram showing a connection manner of constituent elements in the substrate processing apparatus;

FIG. 19 is a diagram showing an example of a structured liquid processing recipe according to a third embodiment; and FIG. 20 is a diagram showing an example of another flow recipe.

DESCRIPTION OF EMBODIMENT(S)

Hereinafter, with reference to attached figures, the embodiments and the variations of the present invention will be described. In the following figures, parts having the same constitution and function are represented by the same reference signs, and redundant description will be omitted below. Further, figures are schematically shown.

Figure 1:
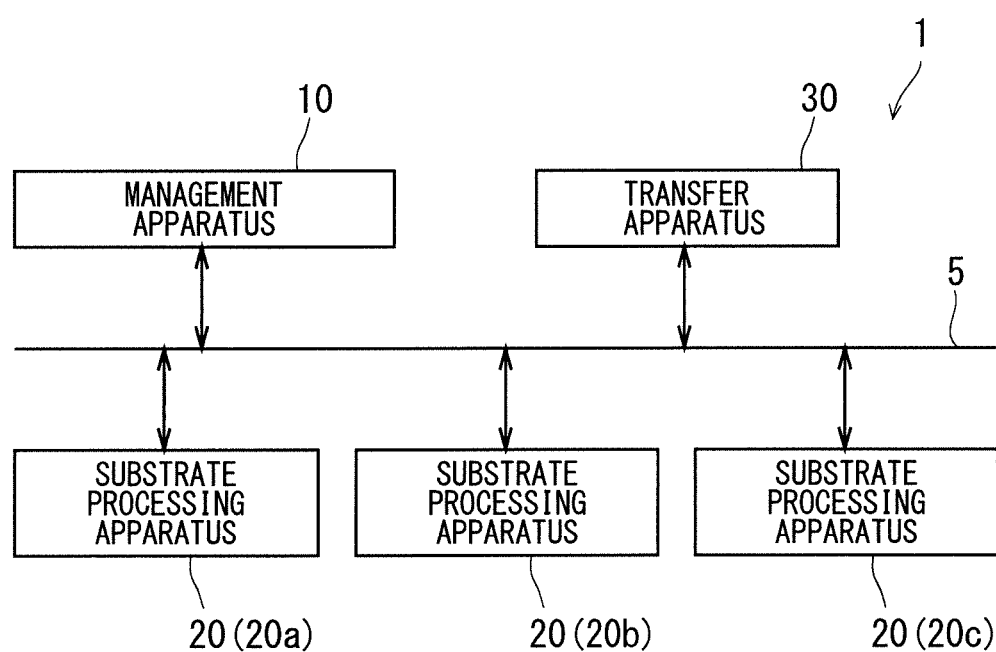
FIG. 1 is a diagram showing an example of a schematic configuration of a substrate processing system according to a first embodiment.

1. The First Embodiment 1-1. Schematic Configuration of Substrate Processing System FIG. 1 is a diagram showing an example of a schematic configuration of a substrate processing system 1 according to the first embodiment. As shown in FIG. 1, the substrate processing system 1 includes, for example, a management apparatus 10, a plurality of substrate processing apparatuses 20, and a transfer apparatus 30. The plurality of substrate processing apparatuses include, for example, a first substrate processing apparatus 20a, a second substrate processing apparatus 20b, and a third substrate processing apparatus 20c. Herein, the management apparatus 10, the plurality of substrate processing apparatuses 20, and the transfer apparatus 30 are connected to one another so as to be capable of transmitting and receiving data via a communication line 5. The communication line 5 may be, for example, a wired line or a wireless line.

1-2. Management Apparatus

Figure 2A:
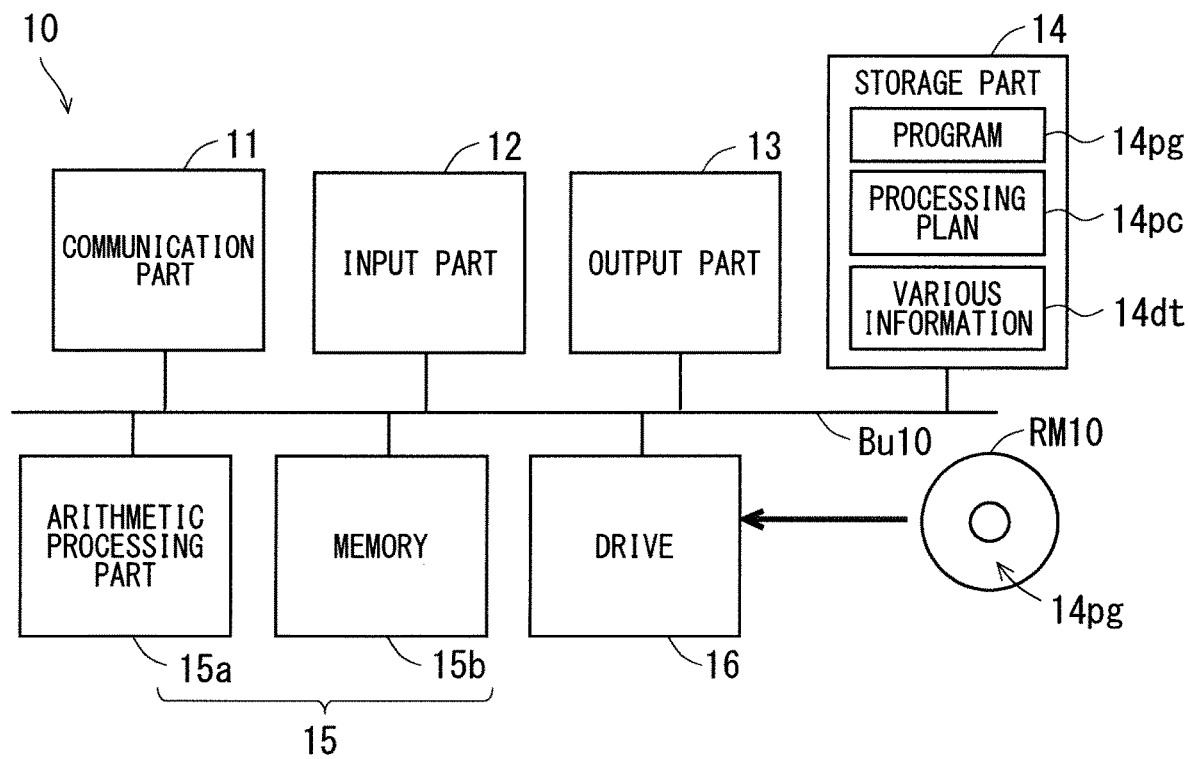
FIGS. 2A and 2B are block diagrams showing an exemplary electrical configuration of a management apparatus and an exemplary functional configuration thereof, respectively.

The management apparatus 10, for example, can generally manage the plurality of substrate processing apparatuses 20. FIG. 2A is a block diagram showing an exemplary electrical configuration of the management apparatus 10. As shown in FIG. 2A, the management apparatus 10 is implemented by, for example, a computer or the like, and includes a communication part 11, an input part 12, an output part 13, a storage part 14, a control part 15, and a drive 16 which are connected to one another via a bus line Bu10.

The communication part 11 has, for example, a function as a transmitting part capable of transmitting a signal to each of the substrate processing apparatuses 20 and the transfer apparatus 30 via the communication line 5, and a function as a receiving part capable of receiving a signal from each of the substrate processing apparatuses 20 and the transfer apparatus 30 via the communication line 5. In other words, the communication part 11 has, for example, a function as a part (also referred to as a first communication part) for transmitting and receiving information to/from each of the plurality of substrate processing apparatuses 20.

The input part 12 can input, for example, a signal in accordance with an operation of a user who uses the management apparatus 10. This input part 12 can include, for example, an operation part, a microphone, various sensors, and the like. The operation part can input, for example, a signal in accordance with an operation of the user. The operation part can include, for example, a mouse, a keyboard, and the like. The microphone can input a signal in accordance with voice and sound of the user. Various sensors can input a signal in accordance with a motion of the user.

The output part 13 can output, for example, various information. The output part 13 can include, for example, a display part, a speaker, and the like. The display part can visibly output, for example, various information in such a manner as the user can recognize. This display part may have a form of touch panel integrated with at least part of the input part 12. The speaker can audibly output, for example, various information in such a manner as the user can recognize.

The storage part 14 can store, for example, information therein. This storage part 14 can be formed of, for example, a nonvolatile storage medium such as a hard disk, a flash memory, or the like. The configuration of the storage part 14 may be, for example, any of a configuration including one storage medium, a configuration including two or more storage media integrally, and a configuration including two or more storage media separately in two or more parts. The storage part 14 can store therein, for example, a program 14pg, processing plan information 14pc, various information 14dt, and the like. The storage part 14 may include, for example, a memory 15b described later.

The processing plan information 14pc indicates a timing of performing a series of substrate processings for a plurality of substrate groups in N (N: natural number) processing unit 21 (see FIG. 3 and the like) described later in each of the substrate processing apparatuses 20. One substrate group consists of, for example, a plurality of substrates W (see FIG. 3 and the like) constituting one lot. In other words, one substrate group includes a group of substrates W.

The various information 14*dt* include, for example, information on each substrate W, a job, a plurality of pieces of identifying information relating to a plurality of processings in the substrate processing apparatus 20, for each group of substrates W. The information on each substrate W can include, for example, the number for a slot at which the substrate W is held in a carrier C, the form of the substrate W, and information (also referred to as already-performed processing information) indicating a processing which has been performed on the substrate W. The information indicating the form of the substrate W can include, for example, the thickness of a film (also referred to as a film thickness) on the substrate W, a distribution of film thicknesses, and the like. The film thickness can be measured by, for example, any one of various film thickness meters, and may be any one of an average value, a minimum value, and a maximum value of the film thicknesses. The plurality of processings in the substrate processing apparatus 20 include, for example, a processing (also referred to as a liquid processing) using a processing liquid to be performed on the substrate W, a processing (also referred to as a measurement processing) for measuring various states related to the processing to be performed on the substrate W, and a processing (also referred to as a correction processing) for correcting a condition of the liquid processing or the measurement processing.

The plurality of pieces of identifying information are information for identifying a plurality of processings performed in the substrate processing apparatus 20, respectively. Herein, the plurality of pieces of identifying information include, for example, identifying information (also referred to as recipe identifying information) for identifying each of a plurality of processing recipes which define conditions of various processings relating to the processing to be performed on the substrate W and identifying information (also referred to as correction formula identifying information) for identifying each of formulas for correction (also referred to as correction formulas) which define various correction processings. The plurality of processing recipes include, for example, a plurality of recipes (also referred to as liquid processing recipes) defining respective conditions of the processings to be performed on the substrate W by using the processing liquid and a plurality of recipes (also referred to as measurement processing recipes) defining respective conditions of the measurement processings. As each of the recipe identifying information and the correction formula identifying information, for example, applied is a numeral, a digit string, a character string, a combination of numerals and characters, or the like which is given to each processing recipe or correction formula.

The control part 15 includes, for example, an arithmetic processing part 15*a* serving as a processor, a memory 15*b* for temporarily storing therein information, and the like. As the arithmetic processing part 15*a*, for example, an electric circuit such as a central processing unit (CPU) or the like can be applied. As the memory 15*b*, for example, a random access memory (RAM) or the like can be applied. The arithmetic processing part 15*a* can implement the function of the management apparatus 10, for example, by reading and executing the program 14*pg* stored in the storage part 14. Various information which are temporarily acquired by various information processings in the control part 15 can be stored in the memory 15*b* or the like as appropriate.

The drive 16 is, for example, a part from/to which a portable storage medium RM10 is detachable and attachable. The drive 16, for example, can cause the transmission and reception of data between the storage medium RM10 and the control part 15 to be performed in a state where the storage medium RM10 is attached. Herein, there may be a case, for example, where the storage medium RM10 in which the program 14*pg* is stored is attached to the drive 16 and the program 14*pg* is read out from the storage medium RM10 and stored into the storage part 14.

Figure 2B:
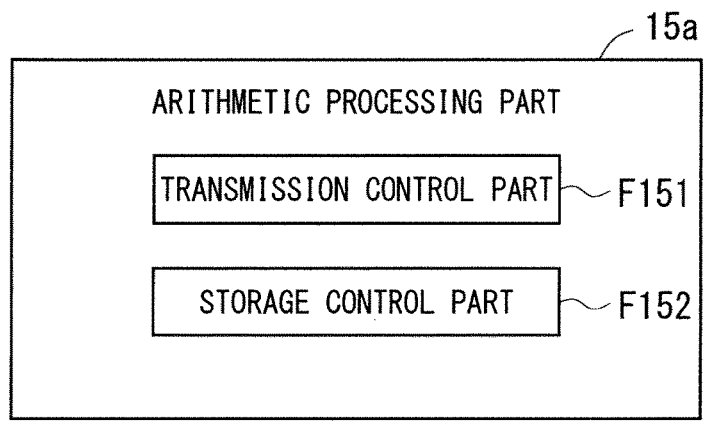

FIG. 2B is a block diagram showing an exemplary functional configuration implemented by the arithmetic processing part 15*a*. As shown in FIG. 2B, the arithmetic processing part 15*a* includes, for example, a transmission control part F151 and a storage control part F152 as implemented functional constituent elements. As a workspace for the processing in each of these constituent elements, for example, used is the memory 15*b*. Herein, at least part of the functions implemented by the arithmetic processing part 15*a* may be implemented by a dedicated electronic circuit.

The transmission control part F151, for example, can cause the communication part 11 to transmit the information of each substrate W, the job, and the plurality of pieces of identifying information, for each group of substrates W, to each of the plurality of substrate processing apparatuses 20. The plurality of pieces of identifying information transmitted herein include, for example, two or more pieces of recipe identifying information which define two or more processing recipes, respectively. These two or more pieces of recipe identifying information may define, for example, the order of processings to be performed by the order of description or the like. Further, the plurality of pieces of identifying information transmitted herein may include, for example, at least one piece of correction formula identifying information. This at least one piece of correction formula identifying information can be associated with, for example, at least one piece of recipe identifying information among two or more pieces of recipe identifying information. Herein, the at least one piece of correction formula identifying information associated with the at least one piece of recipe identifying information can be determined, for example, in accordance with the information (the already-performed processing information, the material, the film thickness, or the like) relating to a prior state of the group of substrates W as a processing object.

The storage control part F152 can store, for example, the information received from each of the plurality of substrate processing apparatuses 20 by using the communication part 11, into the storage part 14.

1-3. Substrate Processing Apparatus

Figure 3:
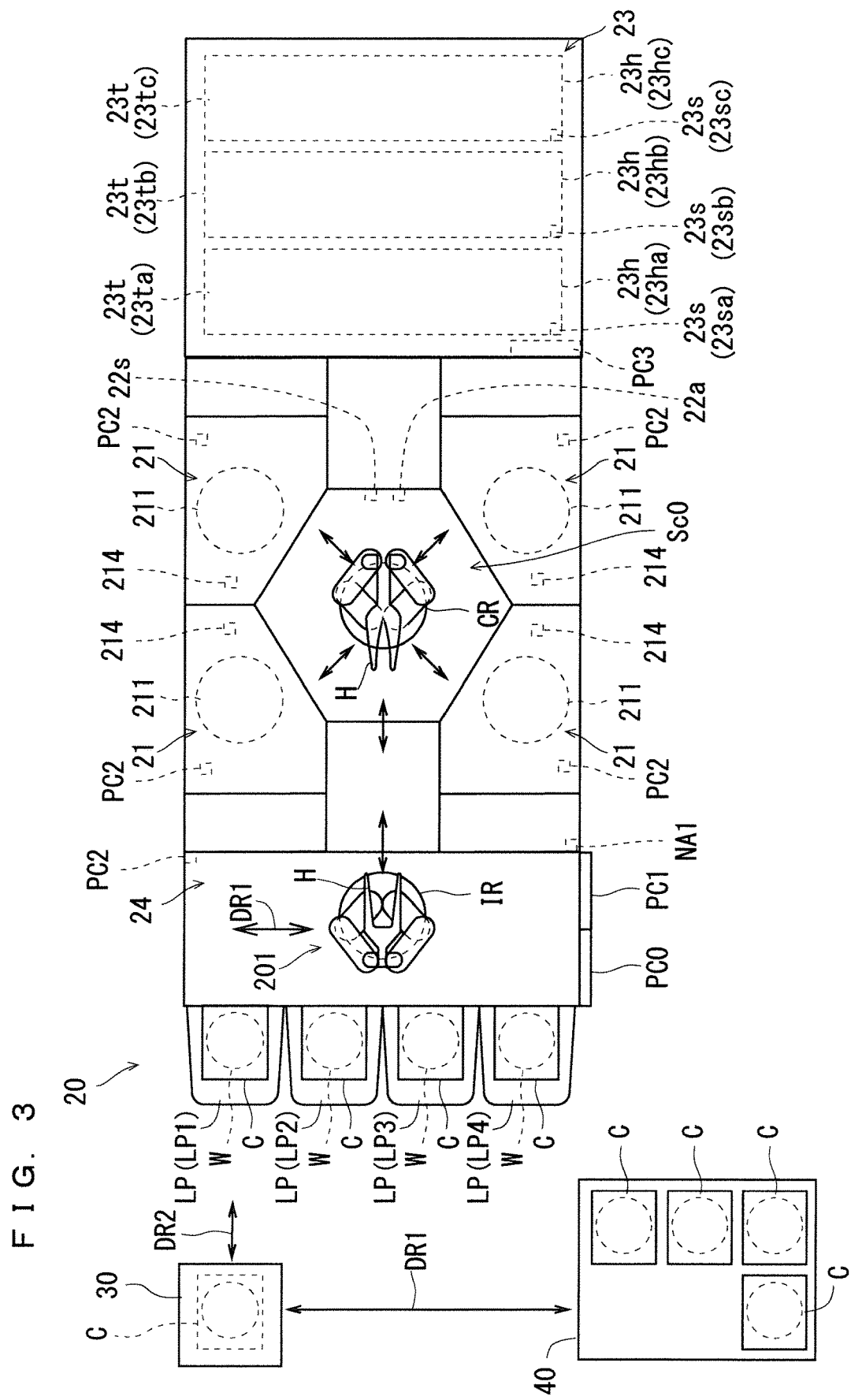
FIG. 3 is a schematic plan view showing an example of a schematic configuration of a substrate processing apparatus.

FIG. 3 is a schematic plan view showing an example of a schematic configuration of the substrate processing apparatus 20. The substrate processing apparatus 20 is, for example, a sheet-fed apparatus which can perform various processings by supplying a processing liquid on a surface of the substrate W. Herein, as an example of the substrate W, used is a semiconductor substrate (wafer). The various processings include, for example, a chemical liquid processing for performing etching with a chemical liquid or the like, a cleaning processing for removing extraneous matters or objects to be removed by using a liquid, a rinse processing for rinsing off the objects with water, a coating processing for applying a resist or the like, and the like.

The substrate processing apparatus 20 includes a plurality of load ports LP, a transfer unit 24, a liquid storage unit 23, and a plurality of processing units 21. Further, the substrate processing apparatus 20 includes, for example, a main body control unit PC0, a schedule management control unit PC1, a plurality of partial control units PC2, a liquid management control unit PC3, and a data storage NA1.

1-3-1. Load Port

Each of the plurality of load ports LP is a mechanism (also referred to as a container holding mechanism) capable of holding a carrier (also referred to as FOUP) C serving as a container. In the exemplary case shown in FIG. 3, as the plurality of load ports LP, first to fourth load ports LP1 to LP4 are present. The first to fourth load ports LP1 to LP4 have a function as a part (also referred to as a load/unload part) for loading and unloading the plurality of substrate groups between the inside and the outside of the substrate processing apparatus 20. In the exemplary case shown in FIG. 3, the first to fourth load ports LP1 to LP4 and the processing units 21 are arranged in a horizontal direction with a space therebetween. Further, the first to fourth load ports LP1 to LP4 are arranged along a horizontal first direction DR1 in a plan view.

Herein, the carrier C is, for example, transferred from the inside of a carrier container 40 by the transfer apparatus 30 and placed on the first to fourth load ports LP1 to LP4. The carrier C can accommodate, for example, a plurality of (in the first embodiment, 25) substrates W as a group of substrates W. An operation of the transfer apparatus 30 can be controlled, for example, by the management apparatus 10. Herein, for example, the transfer apparatus 30 may transfer the carrier C among the plurality of substrate processing apparatuses 20. In the exemplary case shown in FIG. 3, the transfer apparatus 30 can move, for example, along the first direction DR1 and a horizontal second direction DR2 orthogonal to the first direction DR1. For this reason, for example, the carrier C accommodating the plurality of substrates W constituting one substrate group is transferred from the inside of the carrier container 40 and placed on any one of the first to fourth load ports LP1 to LP4. Then, in the first to fourth load ports LP1 to LP4, the plurality of carriers C are arranged along the first direction DR1.

1-3-2. Transfer Unit

The transfer unit 24 can sequentially transfer, for example, the plurality of substrates W in one group of substrates W accommodated in the carrier C held by the load port LP to the plurality of processing units 21. In the first embodiment, the transfer unit 24 includes an indexer robot IR and a center robot CR. The indexer robot IR can transfer, for example, the substrates W between the first to fourth load ports LP1 to LP4 and the center robot CR. The center robot CR can transfer, for example, the substrates W between the indexer robot IR and the processing units 21.

Specifically, for example, the indexer robot IR can transfer the plurality of substrates W one by one from the carrier C to the center robot CR and transfer the plurality of substrates W one by one from the center robot CR to the carrier C. Similarly, for example, the center robot CR can transfer the plurality of substrates W one by one from the indexer robot IR to the processing units 21 and transfer the plurality of substrates W one by one from the processing units 21 to the indexer robot TR. Further, for example, the center robot CR can transfer the substrate W among the plurality of processing units 21 as necessary.

In the exemplary case shown in FIG. 3, the indexer robot IR includes two hands H each having a U-shape in a plan view. The two hands H are arranged at different heights. Each hand H can support the substrate W in a horizontal posture. The indexer robot IR can move the hands H in the horizontal direction and a vertical direction. Further, the indexer robot IR can change the orientation of the hand H by rotating itself around an axis along the vertical direction. The indexer robot IR moves along the first direction DR1 in a path 201 passing a transfer position (at which the indexer robot IR is shown in FIG. 3). The transfer position is a position at which the indexer robot IR faces the center robot CR in a direction orthogonal to the first direction DR1 in a plan view. The indexer robot IR can cause the hands H to face any given carrier C and the center robot CR, respectively. Herein, for example, the indexer robot IR can perform a loading operation for loading the substrate W into the carrier C and an unloading operation for unloading the substrate W from the carrier C by moving the hands H. Further, for example, the indexer robot IR cooperates with the center robot CR to perform the transfer operation for moving the substrate W from one side to the other side of the indexer robot IR and the center robot CR at the transfer position.

In the exemplary case shown in FIG. 3, like the indexer robot IR, the center robot CR includes two hands H each having a U-shape in a plan view. The two hands H are arranged at different heights. Each hand H can support the substrate W in the horizontal posture. The center robot CR can move each of the hands H in the horizontal direction and the vertical direction. Further, the center robot CR can change the orientation of the hand H by rotating itself around an axis along the vertical direction. The center robot CR is surrounded by a plurality of processing units 21 in a plan view. The center robot CR can cause the hands H to face either one of any given processing unit 21 and the indexer robot IR. Herein, for example, the center robot CR can perform the loading operation for loading the substrate W into each of the processing units 21 and the unloading operation for unloading the substrate W from each of the processing units 21 by moving the hands H. Herein, each of the processing units 21 includes a retractable shutter for shielding between itself and the center robot CR. This shutter is opened when the substrate W is loaded into the processing unit 21 and unloaded from the processing unit 21 by the center robot CR. Further, for example, the center robot CR cooperates with the indexer robot IR to perform the transfer operation for moving the substrate W from one side to the other side of the indexer robot IR and the center robot CR.

Furthermore, in an internal space Sc0 of a box where the plurality of processing units 21 and the center robot CR are positioned, provided are a part (also referred to as a gas supply part) 22a for supplying gas (e.g., air) into the internal space Sc0 and a part (also referred to as a sensor part) 22s for detecting an index (e.g., the temperature or the like) indicating the state of an atmosphere in the internal space Sc0. The sensor part 22s may detect the amount of gas supplied from the gas supply part 22a to the internal space Sc0 as one index indicating the state of the atmosphere in the internal space Sc0. Herein, the state of the atmosphere in the internal space Sc0 affects the substrate processing in the plurality of processing units 21. For this reason, the sensor part 22s can acquire signals relating to one or more kinds of indices on the state of the substrate processing in the plurality of processing units 21.

1-3-3. Liquid Storage Unit

The liquid storage unit 23 can store, for example, a processing liquid L1 (see FIG. 4 and the like) to be used by the plurality of processing units 21. This liquid storage unit 23 includes, for example, one or more storage tanks 23t which can store the processing liquid L1. In the exemplary case shown in FIG. 3, in the liquid storage unit 23, present are three storage tanks 23t including a first storage tank 23ta, a second storage tank 23tb, and a third storage tank 23tc. Each of the storage tanks 23t is provided with, for example, a sensor part 23s and a heating part 23h. The sensor part 23s is a part for measuring the physical quantity indicating a state of the processing liquid L1 in the storage tank 23t (e.g., the concentration, the hydrogen ion exponent (pH), the temperature, and the like). This processing liquid L1 is used for the processing of the substrate W in the processing unit 21. Then, the processing liquid L1 can be deteriorated, for example, in accordance with the passage of time and the degree of use. For this reason, the state of the processing liquid L1 affects the substrate processing in the processing unit 21. Specifically, the sensor part 23s can acquire a signal relating to an index on the state of the substrate processing in the plurality of processing units 21. The heating part 23h is a part including a heating element for adjusting the temperature of the processing liquid L1 in the storage tank 23t. As a heating method of the heating element, for example, adopted is a radiant heating method using a halogen lamp, an indirect heating method without any direct touch to the liquid, a radiant heating method using near-infrared light, or the like. In the exemplary case shown in FIG. 3, a first sensor part 23sa and a first heating part 23ha are positioned in the first storage tank 23ta, a second sensor part 23sb and a second heating part 23hb are positioned in the second storage tank 23tb, and a third sensor part 23sc and a third heating part 23hc are positioned in the third storage tank 23tc. Herein, in each of the storage tanks 23t, for example, a mechanism for stirring the processing liquid L1 may be present. Further, for example, one or more storage tanks 23t are connected to each of the processing units 21 in such a state as to supply the processing liquid L1. Herein, each of the storage tanks 23t may be connected to all the plurality of processing units 21 or part of the plurality of processing units 21. Further, herein, the three storage tanks 23t may store therein the same kind of processing liquid L1 or different kinds of processing liquids L1. In other words, among the first storage tank 23ta, the second storage tank 23tb, and the third storage tank 23tc, the same kind of processing liquid L1 may be stored therein or different kinds of processing liquids L1 may be stored therein.

1-3-4. Processing Unit

Each of the plurality of processing units 21 can perform a processing on the substrate W. In the exemplary case shown in FIG. 3, three groups of processing units 21 each consisting of four processing units 21 which are planarly arranged are positioned, being layered in an up-and-down direction. Therefore, twelve processing units 21 in total are present. The plurality of processing units 21 include, for example, two or more processing units 21 for performing the same kind of substrate processing on the substrates W. In the plurality of processing units 21, it is thereby possible to concurrently perform the same kind of substrate processing on the substrates W.

Figure 4:
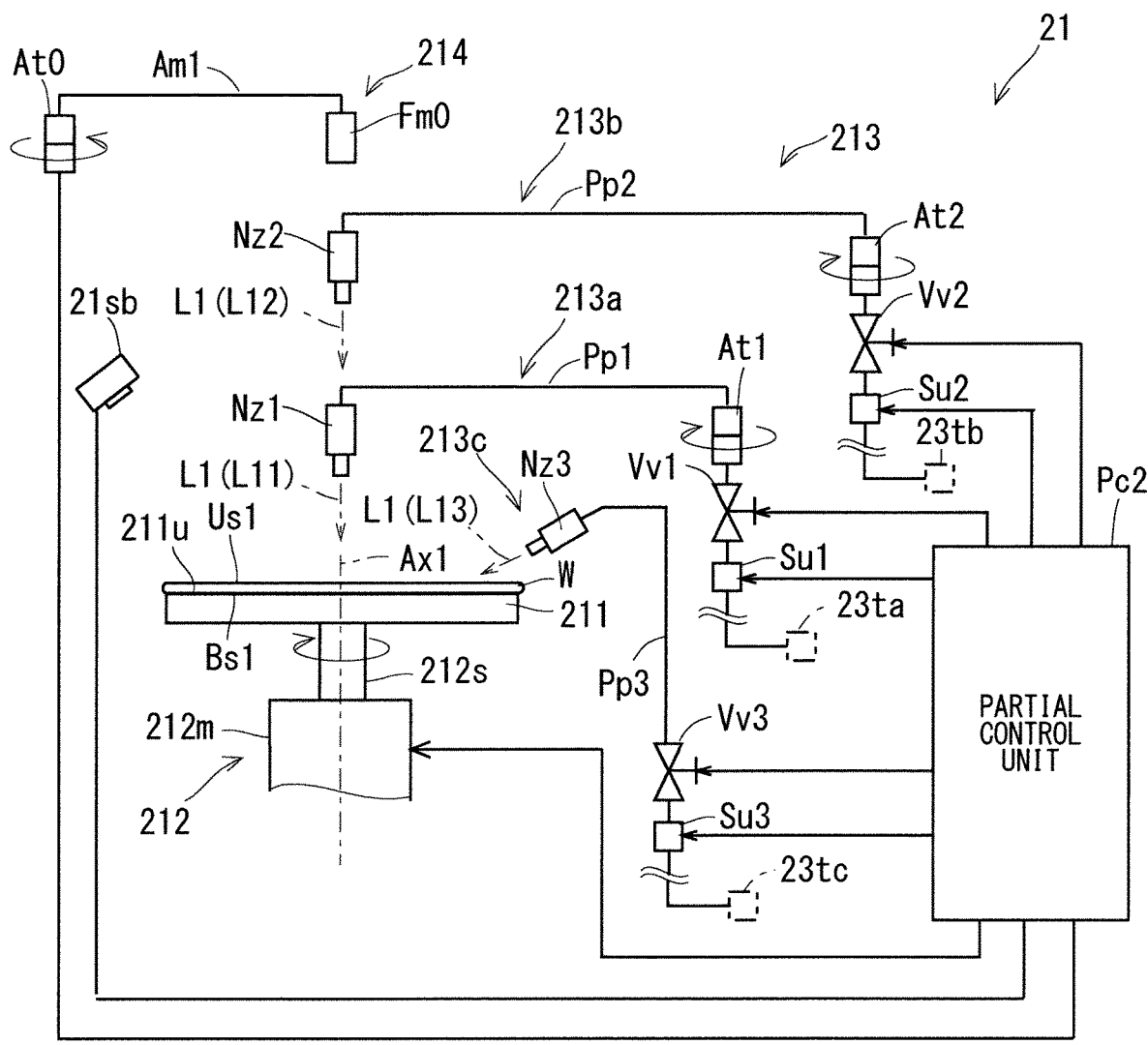
FIG. 4 is a diagram schematically showing an exemplary configuration of a processing unit

FIG. 4 is a diagram schematically showing an exemplary configuration of the processing unit 21. The processing unit 21 can perform a processing on the substrate W by using the processing liquid L1. The processing unit 21 can perform various processings on one main surface (also referred to as an upper surface) Us1 of the substrate W being rotated in a plane, for example, by supplying the processing liquid L1 onto the upper surface Us1 of the substrate W. As the processing liquid L1, for example, applied is a general liquid which has fluidity and is used for substrate processing, such as water or a chemical liquid with relatively low viscosity. As the chemical liquid, applied is an etching solution or a cleaning chemical liquid. More specifically, as the chemical liquid, a liquid including one or more of sulfuric acid, acetic acid, nitric acid, hydrochloric acid, hydrofluoric acid, nitro-hydrofluoric acid, aqueous ammonia, hydrogen peroxide water, organic acid (e.g., citric acid, oxalic acid, or the like), organic alkali (e.g., tetramethylammonium hydroxide (TMAH) or the like), isopropyl alcohol (IPA), a surface active agent, and a corrosion inhibitor can be adopted.

As shown in FIG. 4, the processing unit 21 includes, for example, a holding part 211, a rotation mechanism 212, a processing liquid supply system 213, and a sensor part 214.

The holding part 211 can rotate, for example, the substrate W, being held in a substantially horizontal posture. As the holding part 211, for example, applied is a vacuum chuck including an upper surface 211u which is capable of vacuum-adsorbing the other main surface (also referred to as a lower surface) Bs1 opposite to the upper surface Us1 of the substrate W or a grasping chuck including a plurality of chuck pins capable of grasping a peripheral portion of the substrate W, or the like.

The rotation mechanism 212 can rotate, for example, the holding part 211. As a constitution of the rotation mechanism 212, for example, applied is a constitution including a rotation support shaft 212s and a rotation mechanism 212m. The rotation support shaft 212s includes an upper end portion coupled to the holding part 211 and is extended along the vertical direction. The rotation driving part 212m includes, for example, a motor or the like which is capable of rotating the rotation support shaft 212s around a virtual rotation axis Ax1 along the vertical direction. Herein, for example, when the rotation driving part 212m rotates the rotation support shaft 212s around the rotation axis Ax1, the holding part 211 is rotated while being held in an attitude along a horizontal plane. The substrate W held on the holding part 211 is thereby rotated, for example, around the rotation axis Ax1. Herein, if the upper surface Us1 and the lower surface Bs1 of the substrate W each have a substantially circular shape, for example, the rotation axis Ax1 goes through the center of the upper surface Us1 and the lower surface Bs1 of the substrate W.

The processing liquid supply system 213 can discharge, for example, one or more kinds of processing liquids L1 toward the substrate W. In the exemplary case shown in FIG. 4, the processing liquid supply system 213 includes a first processing liquid supply part 213a, a second processing liquid supply part 213b, and a third processing liquid supply part 213c.

The first processing liquid supply part 213a includes, for example, a nozzle Nz1, a piping part Pp1, a movable piping part At1, a discharge valve Vv1, and a liquid feed part Su1. The nozzle Nz1 can discharge, for example, a first processing liquid L11 which is one of the processing liquids L1 toward the substrate W held by the holding part 211. The piping part Pp1 connects the liquid feed part Su1 and the nozzle Nz1, to thereby form a path in which the first processing liquid L11 flows. Further, the movable piping part At1 is positioned at some midpoint of the piping part Pp1 and supports a part of the piping part Pp1 on the side of the nozzle Nz1 so as to be rotated around an axis along the vertical direction. Then, by the driving force of a driving part such as a motor or the like, for example, it is possible to switch between a state (also referred to as a liquid dischargeable state) where the nozzle Nz1 is positioned above the substrate W and a state (also referred to as a retracted state) where the nozzle Nz1 is not positioned above the substrate W. In the exemplary case shown in FIG. 4, the first processing liquid supply part 213a is in the liquid dischargeable state, and the nozzle Nz1 can discharge the first processing liquid L11 toward the upper surface Us1 of the substrate W from immediately above the substrate W. The discharge valve Vv1 is disposed, for example, at some midpoint of the piping part Pp1 and can be opened or closed in response to a signal from the partial control unit PC2. Herein, when the discharge valve Vv1 is opened, for example, it is brought into a state where the liquid feed part Su1 and the nozzle Nz1 are communicated with each other. Further, when the discharge valve Vv1 is closed, for example, it is brought into another state where the liquid feed part Su1 and the nozzle Nz1 are not communicated with each other. The liquid feed part Su1 can feed, for example, the first processing liquid L11 from the liquid storage unit 23 (herein, the first storage tank 23ta) toward the piping part Pp1 in response to a signal from the main body control unit PC0, the partial control unit PC2, or the like. As the liquid feed part Su1, for example, applied is a pump.

The second processing liquid supply part 213b includes a configuration like that of the first processing liquid supply part 213a. Specifically, the second processing liquid supply part 213b includes, for example, a nozzle Nz2, a piping part Pp2, a movable piping part At2, a discharge valve Vv2, and a liquid feed part Su2. The nozzle Nz2 can discharge, for example, a second processing liquid L12 which is one of the processing liquids L1 toward the substrate W held by the holding part 211. The piping part Pp2 connects the liquid feed part Su2 and the nozzle Nz2, to thereby form a path in which the second processing liquid L12 flows. Further, the movable piping part At2 is positioned at some midpoint of the piping part Pp2 and supports a part of the piping part Pp2 on the side of the nozzle Nz2 so as to be rotated around the axis along the vertical direction. Then, by the driving force of a driving part such as a motor or the like, for example, it is possible to switch between a state (also referred to as the liquid dischargeable state) where the nozzle Nz2 is positioned above the substrate W and a state (also referred to as the retracted state) where the nozzle Nz2 is not positioned above the substrate W. In the exemplary case shown in FIG. 4, the second processing liquid supply part 213b is in the liquid dischargeable state, and the nozzle Nz2 can discharge the second processing liquid L12 toward the upper surface Us1 of the substrate W from immediately above the substrate W. The discharge valve Vv2 is disposed, for example, at some midpoint of the piping part Pp2 and can be opened or closed in response to a signal from the partial control unit PC2. Herein, when the discharge valve Vv2 is opened, for example, it is brought into a state where the liquid feed part Su2 and the nozzle Nz2 are communicated with each other. Further, when the discharge valve Vv2 is closed, for example, it is brought into another state where the liquid feed part Su2 and the nozzle Nz2 are not communicated with each other. The liquid feed part Su2 can feed, for example, the second processing liquid L12 from the liquid storage unit 23 (herein, the second storage tank 23tb) toward the piping part Pp2 in response to a signal from the main body control unit PC0, the partial control unit PC2, or the like. As the liquid feed part Su2, for example, applied is a pump.

Though FIG. 4 shows a case where both the first processing liquid supply part 213a and the second processing liquid supply part 213b are in the liquid dischargeable state, actually, from a state where both the first processing liquid supply part 213a and the second processing liquid supply part 213b are in the retracted state, one of the first processing liquid supply part 213a and the second processing liquid supply part 213b is alternatively changed into the liquid dischargeable state. Further, though the first processing liquid supply part 213a and the second processing liquid supply part 213b have such a positional relation as to be deviated from each other in the up-and-down direction in order to avoid interference with each other in FIG. 4, if the switching operation between the retracted state and the liquid dischargeable state of the first processing liquid supply part 213a and the second processing liquid supply part 213b is appropriately synchronized, even when the first processing liquid supply part 213a and the second processing liquid supply part 213b do not have such a positional relation as to be deviated from each other in the up-and-down direction, the interference with each other can be avoided.

The third processing liquid supply part 213c includes, for example, a nozzle Nz3, a piping part Pp3, a discharge valve Vv3, and a liquid feed part Su3. The nozzle Nz3 can discharge, for example, a third processing liquid L13 which is one of the processing liquids L1 toward the substrate W held by the holding part 211. In the exemplary case shown in FIG. 4, the nozzle Nz3 can discharge the third processing liquid L13 toward the upper surface Us1 of the substrate W from diagonally above the substrate W. The piping part Pp3 connects the liquid feed part Su3 and the nozzle Nz3, to thereby form a path in which the third processing liquid L13 flows. The discharge valve Vv3 is disposed, for example, at some midpoint of the piping part Pp3 and can be opened or closed in response to a signal from the partial control unit PC2. Herein, when the discharge valve Vv3 is opened, for example, it is brought into a state where the liquid feed part Su3 and the nozzle Nz3 are communicated with each other. Further, when the discharge valve Vv3 is closed, for example, it is brought into another state where the liquid feed part Su3 and the nozzle Nz3 are not communicated with each other. The liquid feed part Su3 can feed, for example, the third processing liquid L13 from the liquid storage unit 23 (herein, the third storage tank 23tc) toward the piping part Pp3 in response to a signal from the main body control unit PC0, the partial control unit PC2, or the like. As the liquid feed part Su3, for example, applied is a pump.

The processing unit 21 having the above-described configuration can sequentially perform, for example, the discharge of the first processing liquid L11 from the nozzle Nz1 of the first processing liquid supply part 213a toward the substrate W, the discharge of the second processing liquid L12 from the nozzle Nz2 of the second processing liquid supply part 213b toward the substrate W, and the discharge of the third processing liquid L13 from the nozzle Nz3 of the third processing liquid supply part 213c toward the substrate W.

Herein, the processing liquid L1 discharged from each of the nozzles Nz1 to Nz3 toward the substrate W is, for example, collected by a cup or the like which is provided from the side of the substrate W toward the lower portion thereof and carried back into the corresponding storage tank 23t in the liquid storage unit 23. In other words, the processing liquid L1 stored in the liquid storage unit 23 is repeatedly used for the substrate processing in a circulating manner. At that time, for example, the processing liquid L1 tends to be gradually deteriorated in accordance with the number of uses. Herein, when the processing liquid L1 is carried back from the processing unit 21 into the liquid storage unit 23, the processing liquid L1 may be purified by a filter or the like.

Further, herein, in the processing unit 21, one to two or four or more processing liquid supply parts may be present.

The sensor part 214 can acquire, for example, a signal relating to an index on the state of the substrate processing in the processing units 21. In the exemplary case shown in FIG. 4, the sensor part 214 includes a film thickness meter Fm0 and an image pickup part 21sb which are used for acquiring a signal relating to one or more kinds of indices indicating the state of the substrate W. As the film thickness meter Fm0, for example, a reflection spectroscopic film thickness meter or the like which uses the interference of light can be applied. This reflection spectroscopic film thickness meter, for example, can perform spectroscopy using a prism or the like and calculate the film thickness by using a transformation formula from light having a wavelength with high intensity in interference of light. Herein, in the reflection spectroscopic film thickness meter, for example, when the transformation formula used for calculating the film thickness is corrected in accordance with the refractive index depending on the temperature for each material, the measurement accuracy for the film thickness can be increased. As the image pickup part 21sb, for example, applied is a member using an image pickup element such as an area sensor in which light receiving elements are planarly arranged, or the like.

The film thickness meter Fm0 is fixed, for example, to an arm part Am1 supported by a movable part At0 so as to be rotated around an axis along the vertical direction. Then, when the arm part Am1 is rotated by the driving force of the driving part such as a motor or the like, for example, it is possible to switch between a state (also referred to as a measurable state) where the film thickness meter Fm0 is positioned above the substrate W and a state (also referred to as a retracted state) where the film thickness meter Fm0 is not positioned above the substrate W. The film thickness meter Fm0 may be protected, for example, by a shield used for protection from deposition of the processing liquid L1 in the retracted state. Herein, by rotating the arm part Am1 while the rotation mechanism 212 rotates the substrate W as appropriate, the film thickness meter Fm0 can measure the thickness (film thickness) of one of various films positioned in a wide range on the substrate W. Also in this case, the film thickness may be, for example, any one of an average value, a minimum value, and a maximum value of the film thicknesses at a plurality of portions. Herein, as the film positioned on the substrate W, for example, various films such as an oxide film, a silicon single crystal layer, a silicon polycrystalline layer, an amorphous silicon layer, a resist film, and the like can be adopted. The film thickness meter Fm0 can measure, for example, the film thickness of the film on the substrate W before and after the processing performed on the substrate W by using the processing liquid L1 in the processing unit 21. It is thereby possible to acquire a signal relating to the film thickness as one index on the state of the substrate processing in the processing unit 21. The film thickness meter Fm0 sends out the acquired signal to, for example, the partial control unit PC2. Though FIG. 4 shows, for convenience, the distance between the upper surface Us1 of the substrate W and the film thickness meter Fm0 in the measurable state as if it is large, actually, the film thickness meter Fm0 measures the film thickness while being very close to the upper surface Us1 of the substrate W.

The image pickup part 21sb can acquire an image signal relating to the state of the upper surface Us1 of the substrate W as one index on the state of the substrate processing in the processing unit 21, for example, by imaging the state on the substrate W before and after the processing performed on the substrate W by using the processing liquid L1 in the processing unit 21. The image pickup part 21sb sends out the acquired image signal to, for example, the partial control unit PC2.

The sensor part 214 may include, for example, a flowmeter for detecting the amount of processing liquid L1 discharged from each of the nozzles Nz1 to Nz3 and a sensor (e.g., an angle sensor or the like) for detecting a position (also referred to as a discharge position) at which each of the nozzles Nz1 and Nz2 discharges the processing liquid L1.

1-3-5. Main Body Control Unit

The main body control unit PC0 can perform, for example, transmission and reception of data to/from the management apparatus 10, control over respective operations of the constituent elements in the substrate processing apparatus 20, and the like.

FIG. 5 is a block diagram showing a connection manner of a control system and a data transmission and reception system in the substrate processing apparatus 20. Herein, the main body control unit PC0, the schedule management control unit PC1, a plurality of partial control units PC2, and the liquid management control unit PC3 are connected to one another so as to be capable of transmitting and receiving various control signals via a control communication line L0c. Further, the main body control unit PC0, the schedule management control unit PC1, a plurality of partial control units PC2, the liquid management control unit PC3, and the data storage NA1 are connected to one another so as to be capable of transmitting and receiving various data via a data communication line L0d. The control communication line L0c and the data communication line L0d may be each a wired line or a wireless line.

Figure 6A:
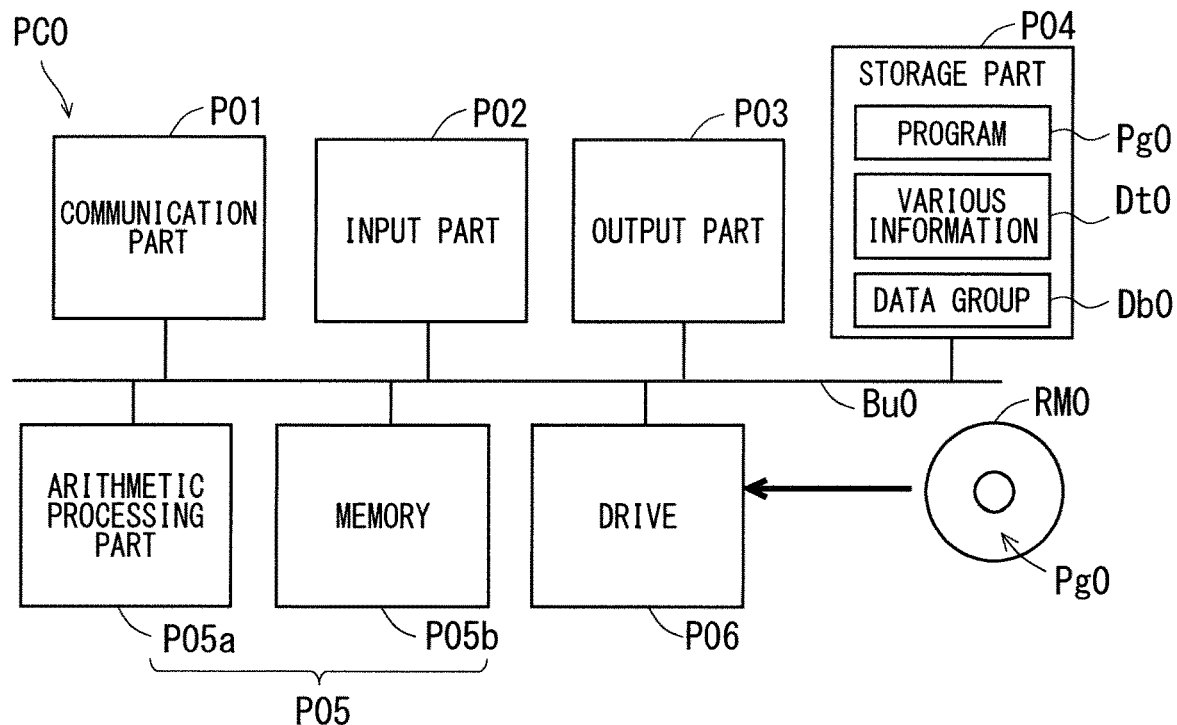
FIGS. 6A and 6B are block diagrams showing an exemplary electrical configuration of a main body control unit and an exemplary functional configuration thereof, respectively.

FIG. 6A is a block diagram showing an exemplary electrical configuration of the main body control unit PC0. As shown in FIG. 6A, the main body control unit PC0 is implemented by, for example, a computer or the like, and includes a communication part P01, an input part P02, an output part P03, a storage part P04, a control part P05, and a drive P06 which are connected to one another via a bus line Bu0.

The communication part P01 has, for example, respective functions as a transmitting part and a receiving part which are capable of transmitting and receiving a signal among the schedule management control unit PC1, the plurality of partial control units PC2, and the liquid management control unit PC3 via the control communication line L0c and transmitting and receiving data among the schedule management control unit PC1, the plurality of partial control units PC2, the liquid management control unit PC3, and the like via the data communication line L0d. Further, the communication part P01 has, for example, a function for transmitting and receiving information to/from the management apparatus 10 via the communication line 5. In other words, the communication part P01 has, for example, a function as a part (also referred to as a second communication part) for transmitting and receiving information to/from the management apparatus 10. In this case, the communication part P01 can receive, for example, information of each of the substrates W for each group of substrates W, a job, and two or more pieces of identifying information which are transmitted from the management apparatus 10.

The input part P02 can input, for example, a signal in accordance with an operation of a user who uses the substrate processing apparatus 20. Herein, like the above-described input part 12, the input part P02 can include, for example, an operation part, a microphone, various sensors, and the like. The input part P02 may input, for example, a signal instructing manual correction of information of a recipe.

The output part P03 can output, for example, various information. Like the above-described output part 13, this output part P03 can include, for example, a display part, a speaker, and the like. The display part may have a form of touch panel integrated with at least part of the input part P02.

The storage part P04 can store, for example, information therein. This storage part P04 can be formed of, for example, a nonvolatile storage medium such as a hard disk, a flash memory, or the like. As the storage part P04, for example, any one of configurations where one storage medium is formed, where two or more storage media are formed as a unit, and where two or more storage media are formed separately in two or more parts may be adopted. The storage part P04 stores therein, for example, a program Pg0, various information Dt0, and a data group Db0. The storage part P04 may include a memory P05b described later.

The various information Dt0 include, for example, information of each of the substrates W for each group of substrates W, a job, a plurality of pieces of identifying information, and the like which are transmitted from the management apparatus 10.

Figure 7:
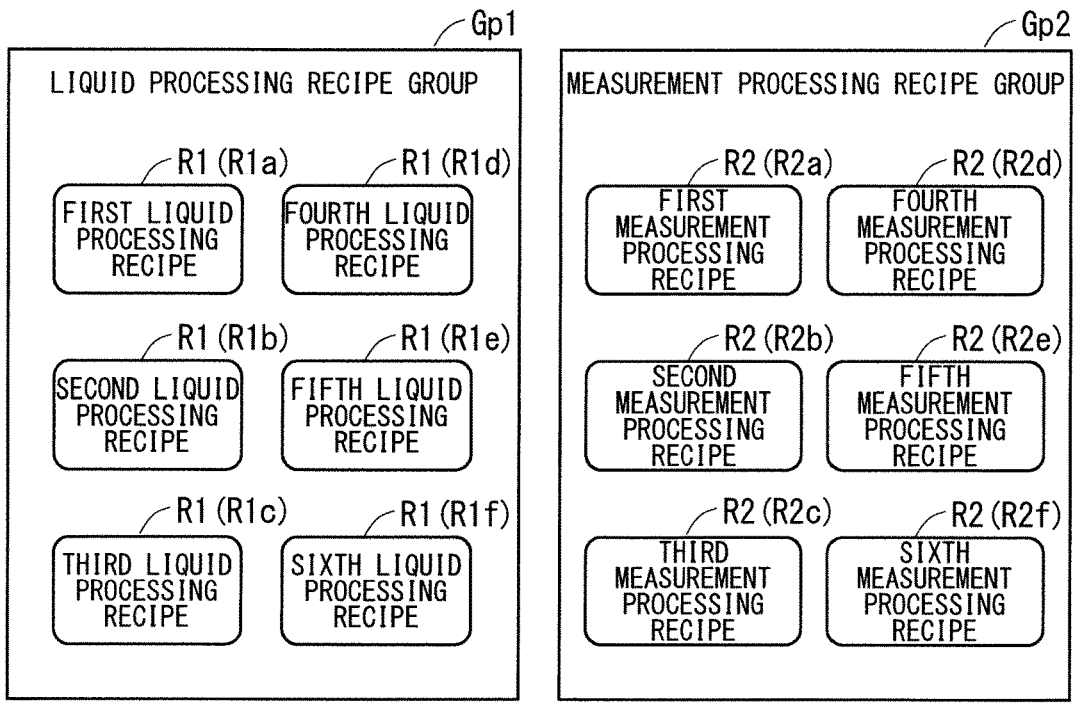
FIG. 7 is a diagram showing exemplary contents of a data group.
Figure 7:
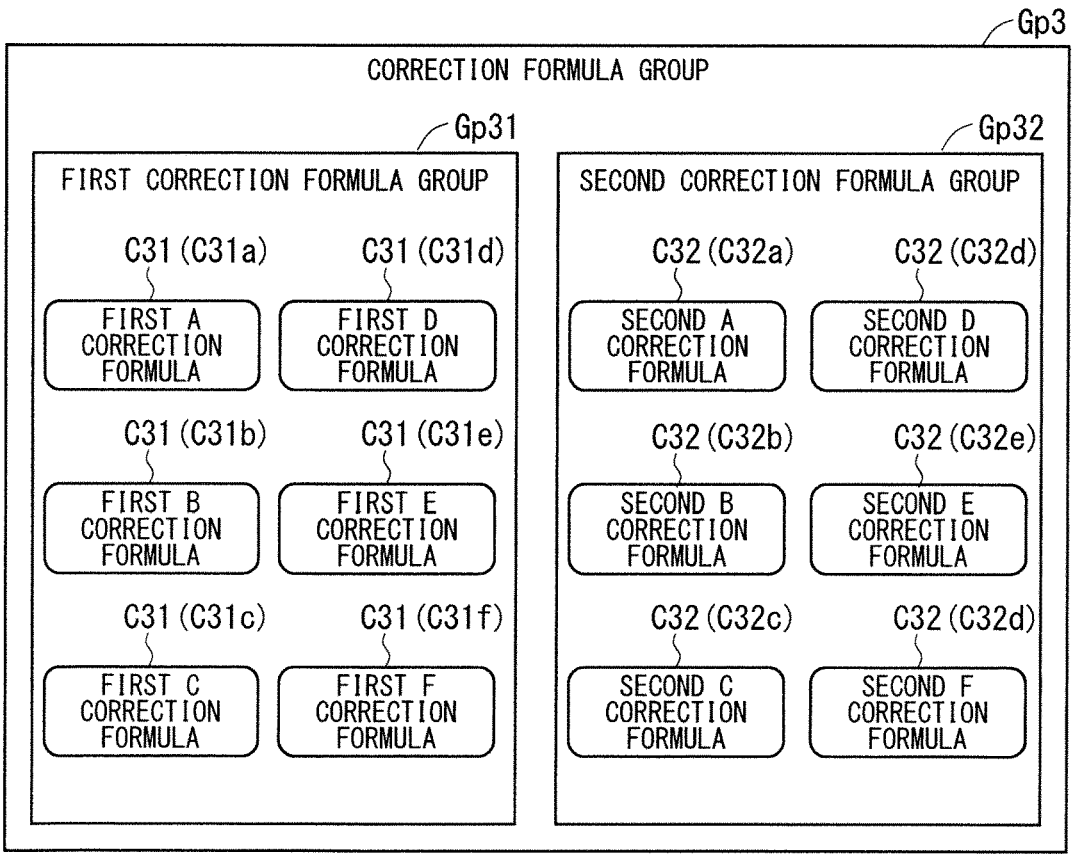

FIG. 7 is a diagram showing exemplary contents of the data group Db0. As shown in FIG. 7, the data group Db0 includes, for example, a liquid processing recipe group Gp1, a measurement processing recipe group Gp2, and a correction formula group Gp3.

The liquid processing recipe group Gp1 includes, for example, a plurality of liquid processing recipes R1. In the exemplary case shown in FIG. 7, the plurality of liquid processing recipes R1 include a first liquid processing recipe R1a, a second liquid processing recipe R1b, a third liquid processing recipe R1c, a fourth liquid processing recipe R1d, a fifth liquid processing recipe R1e, and a sixth liquid processing recipe R1f. Specifically, as the plurality of liquid processing recipes R1, for example, a recipe defining a condition of a chemical liquid processing for performing etching with a chemical liquid or the like, a recipe defining a condition of a cleaning processing for removing extraneous matters or objects to be removed by using a liquid, a recipe defining a condition of a rinse processing for rinsing off the objects with water, a recipe defining a condition of a coating processing for applying a resist or the like, and the like can be applied. Further, in a case where the chemical liquid processing consists of a processing using the first processing liquid L11, a processing using the second processing liquid L12, a processing using the third processing liquid L13, a dry processing, and the like, for example, as the plurality of liquid processing recipes R1, a recipe defining a condition of the processing using the first processing liquid L11, a recipe defining a condition of the processing using the second processing liquid L12, a recipe defining a condition of the processing using the third processing liquid L13, a recipe defining a condition of the dry processing, and the like may be individually applied. Herein, as the first processing liquid L11, for example, nitrohydrofluoric acid obtained by mixing hydrofluoric acid and nitric acid as the etching solution can be applied. As the second processing liquid L12, for example, a mixed solution (SC1) of aqueous ammonia and hydrogen peroxide water as a cleaning solution can be applied. As the third processing liquid L13, for example, pure water (DIW: Deionized Water) as a rinse liquid can be applied. Further, for example, a condition of the chemical liquid processing consisting of the processing using the first processing liquid L11, the processing using the second processing liquid L12, the processing using the third processing liquid L13, the dry processing, and the like may be defined by one liquid processing recipe R1 or may be defined by any number of (two or more) liquid processing recipes R1.

The measurement processing recipe group Gp2 includes, for example, a plurality of measurement processing recipes R2. In the exemplary case shown in FIG. 7, the plurality of measurement processing recipes R2 include a first measurement processing recipe R2a, a second measurement processing recipe R2b, a third measurement processing recipe R2c, a fourth measurement processing recipe R2d, a fifth measurement processing recipe R2e, and a sixth measurement processing recipe R2f. The measurement processing recipe R2 defines, for example, a condition of the measurement processing performed by the sensor part 214 to acquire a signal relating to an index of the state of the substrate processing in the processing unit 21. There is a possible case, for example, where the measurement processing recipe R2 defines a condition for measuring the thickness of a film on the substrate W by using the film thickness meter Fm0. Further, the plurality of measurement processing recipes R2 can include, for example, recipes defining respective conditions for measurements in which the position at which the film thickness is measured by the film thickness meter Fm0 and the number of measurements are different from one another. Furthermore, for example, the measurement processing recipe group Gp2 may include one or more measurement processing recipes R2 or may include any number of (two or more) measurement processing recipes R2.

Thus, the data group Db0 includes the plurality of processing recipes including the plurality of liquid processing recipes R1 and one or more measurement processing recipes R2.

The correction formula group Gp3 includes, for example, a first correction formula group Gp31 and a second correction formula group Gp32. The first correction formula group Gp31 includes, for example, one or more first correction formulas C31 for correcting at least part of the conditions of the liquid processing recipes R1. In the exemplary case shown in FIG. 7, one or more first correction formulas C31 include a first A correction formula C31a, a first B correction formula C31b, a first C correction formula C31c, a first D correction formula C31d, a first E correction formula C31e, and a first F correction formula C31f. As each of the first correction formulas C31, for example, applied is a formula for correcting at least part of the conditions of the liquid processing recipes R1 on the basis of a signal relating to an index acquired by the sensor parts 22s, 23s, and 214.

In a case where the liquid processing recipe R1 defines a condition such as time (also referred to as etching time) for performing etching of the film on the substrate W by using the processing liquid, or the like, for example, there is a possible case where the first correction formula C31 is used for a correction processing for changing the etching time or the like which is a numerical value to be corrected, which is part of the conditions defined by the liquid processing recipes R1, in accordance with the indices such as the concentration and the temperature of the processing liquid, the etching rate, and the like. As the etching time, for example, applied is time for supplying the etching solution onto the substrate W, or the like. In this case, a possible correction formula is, for example, a formula for calculating a coefficient (also referred to as a correction coefficient) by which a numerical value (e.g., the etching time) which is part of the conditions to be corrected is multiplied, to correct this numerical value, by applying the index to a variable. For example, the correction formula may be a formula in which a coefficient is given to a part including one variable or may be a formula in which a coefficient is given to each of parts including two or more variables. A possible correction formula is, for example, a formula for calculating the correction coefficient by multiplying a first value obtained by multiplying a part including a first variable by a first coefficient by a second value obtained by multiplying a part including a second variable by a second coefficient. Further, the correction formula may be, for example, a formula for obtaining a value by multiplying the numerical value to be corrected by a correction coefficient (also referred to as a first correction coefficient) and then adding a third value (also referred to as a second correction coefficient) obtained by multiplying a part including a third variable by a third coefficient to the above value.

Herein, an initial value of the correction coefficient is, for example, assumed to be "1". Further, for example, the part including the first variable may be changed step by step in response to the change of a first index and the part including the second variable may be changed step by step in response to the change of a second index. Herein, considered is a case, for example, where the first index is an etching rate (also referred to as a first etching rate) in the latest etching processing performed on the substrate W in one processing unit 21, the second index is an etching rate (also referred to as a second etching rate) in the latest etching processing performed on the substrate W in another processing unit 21, and a third index is a numerical value indicating the number of uses since the last liquid exchange of the processing liquid L1 in the storage tank 23t. In this case, for example, the first to third coefficients serve as the coefficients for adding the weights to the first to third indices. Herein, it is assumed, for example, that the first coefficient is any given number from 0 to 1 (e.g., 0.8 or the like), the second coefficient is (1—(the first coefficient) or the like), and the third coefficient is any given number (e.g., 0.1 or the like). Then, there is a possible case, for example, where the part including the first variable is "1" when a value obtained by dividing a reference value of the first etching rate by the first etching rate as the first index is 0.95 to 1.05 and the part including the first variable is "1.1" when a value obtained by dividing the reference etching rate by the first etching rate as the first index is 1.05 to 1.15. Further, there is another possible case, for example, where the part including the second variable is "1" when a value obtained by dividing a reference value of the second etching rate by the second etching rate as the second index is 0.95 to 1.05 and the part including the second variable is "1.1" when a value obtained by dividing the reference value of the second etching rate by the second etching rate as the second index is 1.05 to 1.15. The part including the second variable may be set to, for example, the same value as the part including the first variable. Further, as the part including the third variable, for example, when the processing liquid L1 is new, the value indicating the number of uses is "0", and the value indicating the number of uses is a natural number not smaller than 1 in accordance with the use of the processing liquid L1. Herein, since the processing capability of the processing liquid L1 is deteriorated in accordance with the number of uses, there is a possible case, for example, where the etching time is extended by 0.1 hour when the number of uses is one, and the etching time is extended by 0.2 hour when the number of uses is two.

The second correction formula group Gp32 includes, for example, one or more second correction formulas C32 for correcting at least part of the conditions of the measurement processing recipes R2. In the exemplary case shown in FIG. 7, one or more second correction formulas C32 include a second A correction formula C32a, a second B correction formula C32b, a second C correction formula C32c, a second D correction formula C32d, a second E correction formula C32e, and a second F correction formula C32f As each of the second correction formulas C32, for example, applied is a formula for correcting at least part of the conditions of the measurement processing recipes R2 on the basis of a signal relating to an index acquired by the sensor parts 22s, 23s, 214, and the like. Herein, in a case where the measurement processing recipe R2 defines a condition for measuring the thickness of the film (film thickness) on the substrate W by using the film thickness meter Fm0, for example, there is a possible case where the second correction formula C32 is used for a correction processing for changing the transformation formula used for calculating the film thickness which is part of the conditions defined by the measurement processing recipes R2, in accordance with the indices such as the temperature and the like of the processing unit 21. In such a manner, the second correction formula C32 can be set, for example, for each of the film materials.

The control part P05 includes, for example, an arithmetic processing part P05a serving as a processor, a memory P05b for temporarily storing therein information, and the like. As the arithmetic processing part P05a, for example, an electric circuit such as a CPU or the like can be adopted, and as the memory P05b, for example, a RAM or the like can be adopted. The arithmetic processing part P05a can implement the function of the main body control unit PC0, for example, by reading and executing the program Pg0 stored in the storage part P04. Various information which are temporarily acquired by various information processings in the control part P05 can be stored in the memory P05b or the like as appropriate.

The drive P06 is, for example, a part from/to which a portable storage medium RM0 is detachable and attachable. The drive P06, for example, can cause transmission and reception of data between the storage medium RM0 and the control part P05 to be performed in a state where the storage medium RM0 is attached. Further, there may be a case where the storage medium RM0 in which the program Pg0 is stored is attached to the drive P06 and the program Pg0 is read out from the storage medium RM0 and stored into the storage part P04.

Figure 6B:
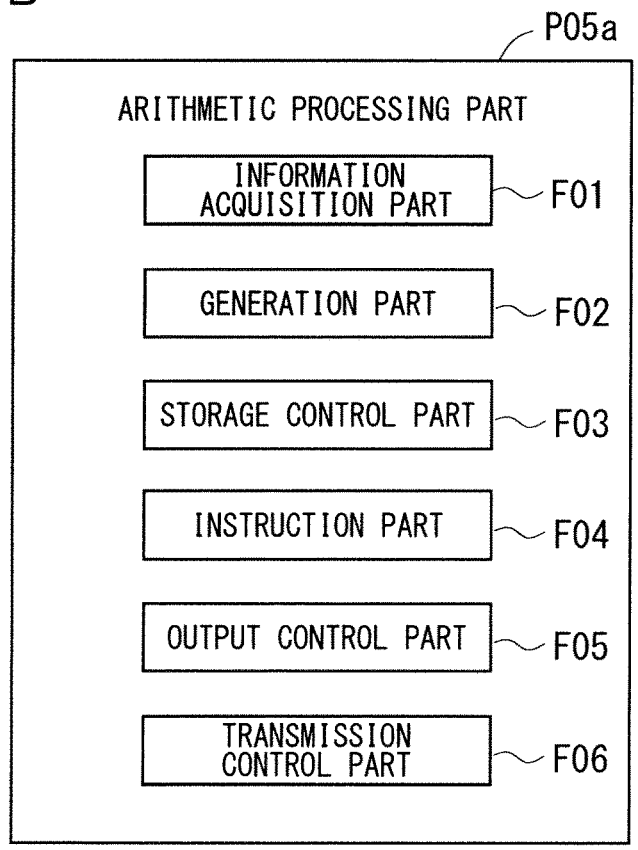

FIG. 6B is a block diagram showing an exemplary functional configuration implemented by the arithmetic processing part P05a. As shown in FIG. 6B, the arithmetic processing part P05a includes, for example, an information acquisition part F01, a generation part F02, a storage control part F03, an instruction part F04, an output control part F05, and a transmission control part F06 as implemented functional constituent elements. As a workspace for the processing in each of these constituent elements, for example, used is the memory P05b. Herein, at least part of the functions implemented by the arithmetic processing part P05a may be implemented by a dedicated electronic circuit.

The information acquisition part F01 can acquire, for example, information of each substrate W for each group of substrates W, a job, and two or more pieces of identifying information which are transmitted from the management apparatus 10. The information of each substrate W includes, for example, the number for a slot at which the substrate W is held in a carrier C, the form of the substrate W (the film thickness, a distribution of film thicknesses, and the like), and the already-performed processing information. The two or more pieces of identifying information include, for example, two or more pieces of recipe identifying information and at least one piece of correction formula identifying information associated with at least one piece of recipe identifying information out of the two or more pieces of recipe identifying information.

The generation part F02 can generate, for example, a recipe (also referred to as a flow recipe) FL1 defining a flow of a series of processings for a substrate W. The generation part F02 can generate, for example, the flow recipe FL1 defining the flow of the series of processings for the substrate W by combining two or more processing recipes among the plurality of processing recipes defining respective processing conditions stored in the storage part P04. In the first embodiment, the generation part F02 can generate, for example, the flow recipe FL1 by combining the two or more processing recipes among the plurality of processing recipes stored in the storage part P04 on the basis of the two or more pieces of identifying information acquired by the information acquisition part F01. Herein, for example, the order of combination of the two or more processing recipes can be set in accordance with the order of description, or the like, of the two or more pieces of identifying information. Thus, for example, one flow recipe FL1 can be generated for a group of substrates W such as twenty-five substrates W accommodated in the one carrier C.

Then, when such a configuration is adopted, for example, even if the conditions of the series of processings to be performed on the substrate W increase, the flow recipe FL1 can be generated by combining the two or more processing recipes among the plurality of processing recipes which are prepared in advance, instead of increasing the number of flow recipes FL1 which are prepared in advance. It is thereby possible, for example, to reduce the amount of data which are prepared in advance in the substrate processing system 1, the management apparatus 10, the substrate processing apparatus 20, or the like. As a result, it is possible, for example, to reduce the amount of data to be used in the substrate processing system 1, the management apparatus 10, the substrate processing apparatus 20, or the like.

Figure 8:
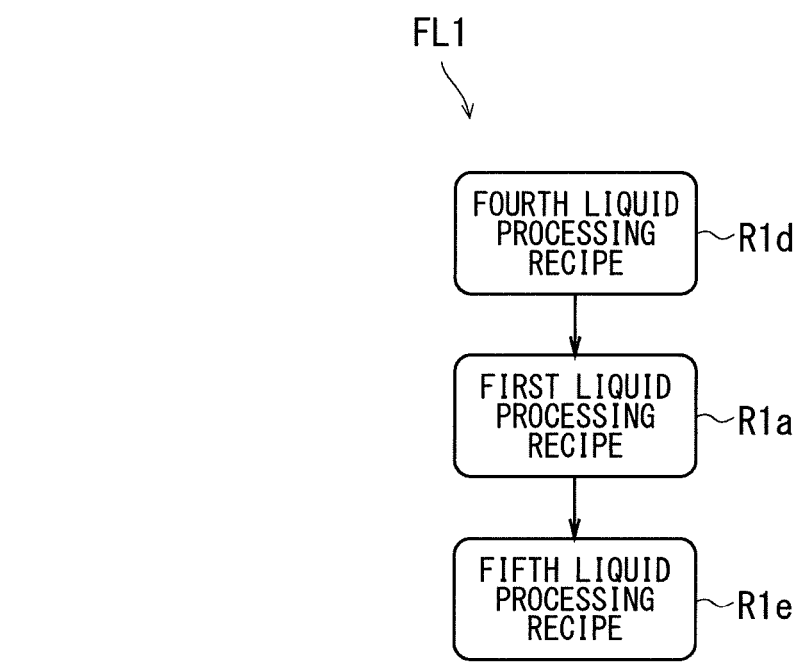
FIG. 8 is a diagram showing an example of a flow recipe.

Herein, there is a possible case where the two or more processing recipes constituting the flow recipe FL1 include, for example, two or more liquid processing recipes R1. FIG. 8 is a diagram showing an example of the flow recipe FL1. The flow recipe FL1 shown in FIG. 8 can be generated, for example, by combining the fourth liquid processing recipe R1d, the first liquid processing recipe R1a, and the fifth liquid processing recipe R1e in this order of description among the plurality of liquid processing recipes R1 stored in the storage part P04. Herein, the fourth liquid processing recipe R1d defines, for example, the condition of the processing (the etching processing or the like) using the first processing liquid L11 such as nitrohydrofluoric acid or the like, the first liquid processing recipe R1a defines, for example, the condition of the processing (a cleaning processing, or the like) using the second processing liquid L12 such as the SC1 solution or the like, and the fifth liquid processing recipe R1e defines, for example, the condition of the processing (the rinse processing or the like) using the third processing liquid L13 such as pure water or the like. In this case, the generation part F02 generates the flow recipe FL1, for example, by combining the two or more liquid processing recipes R1 among the plurality of liquid processing recipes R1 stored in the storage part P04. When such a configuration is adopted, for example, even if the conditions of the series of processings to be performed on the substrate W increase, the flow recipe FL1 can be generated by combining the two or more liquid processing recipes among the plurality of processing recipes which are prepared in advance, instead of increasing the number of flow recipes FL1 which are prepared in advance. As a result, it is possible, for example, to reduce the amount of data to be used in the substrate processing system 1, the management apparatus 10, the substrate processing apparatus 20, or the like.

Figure 9:
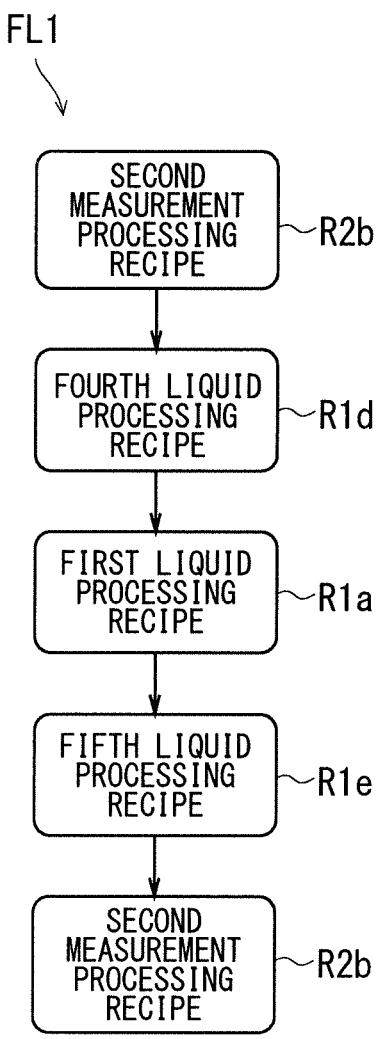
FIG. 9 is a diagram showing another example of the flow recipe.

Further, herein, there is a possible case where the two or more processing recipes constituting the flow recipe FL1 include, for example, one or more liquid processing recipes R1 and one or more measurement processing recipes R2. FIG. 9 is a diagram showing another example of the flow recipe FL1. The flow recipe FL1 shown in FIG. 9 can be generated, for example, by combining the second measurement processing recipe R2b, the fourth liquid processing recipe R1d, the first liquid processing recipe R1a, the fifth liquid processing recipe R1e, and the second measurement processing recipe R2b in this order of description among the plurality of liquid processing recipes R1 and the plurality of measurement processing recipes R2 stored in the storage part P04. Herein, there is a possible case, for example, where the second measurement processing recipe R2b defines the condition for measuring the film thickness of a thin film on the substrate W. In this case, the generation part F02 generates the flow recipe FL1, for example, by combining the one or more liquid processing recipes R1 among the plurality of liquid processing recipes R1 stored in the storage part P04 and the one or more measurement processing recipes R2 among the plurality of measurement processing recipes R2 stored in the storage part P04. When such a configuration is adopted, for example, it is possible to generate the flow recipe FL1 by combining the two or more processing recipes among the plurality of processing recipes including the processing recipes for not only the liquid processing but also the measurement processing. Even if the conditions of the series of processings including the measurement processing to be performed on the substrate W increase, for example, the flow recipe FL1 can be thereby generated by combining the two or more processing recipes among the plurality of processing recipes which are prepared in advance, instead of increasing the number of flow recipes FL1 which are prepared in advance. As a result, it is possible, for example, to reduce the amount of data to be used in the substrate processing system 1, the management apparatus 10, the substrate processing apparatus 20, or the like.

Figure 10:
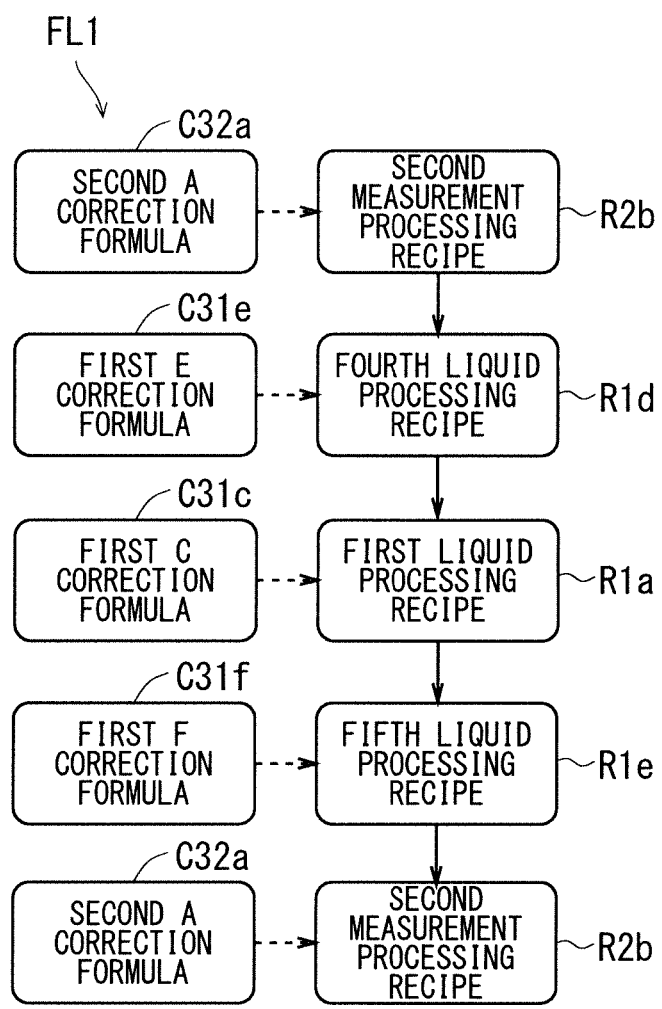
FIG. 10 is a diagram showing one other example of the flow recipe.

Further, herein, at least one processing recipe among the two or more processing recipes constituting the flow recipe FL1 may be combined with at least one correction formula. FIG. 10 is a diagram showing one other example of the flow recipe FL1. The flow recipe FL1 shown in FIG. 10 can be generated, for example, by combining the second measurement processing recipe R2b, the fourth liquid processing recipe R1d, the first liquid processing recipe R1a, the fifth liquid processing recipe R1e, and the second measurement processing recipe R2b in this order of description among the plurality of processing recipes stored in the storage part P04 and combining each of the processing recipes with the first correction formula C31 or the second correction formula C32. Specifically, herein, for example, the second measurement processing recipe R2b is combined with the second A correction formula C32a, the fourth liquid processing recipe R1d is combined with the first E correction formula C31e, the first liquid processing recipe R1a is combined with the first C correction formula C31c, the fifth liquid processing recipe R1e is combined with the first F correction formula C31f, and the second measurement processing recipe R2b is combined with the second A correction formula C32a. In this case, the generation part F02 generates the flow recipe FL1, for example, by combining at least one processing recipe among the two or more processing recipes with at least one correction formula. Even if the conditions of the processings including the correction of the processing increase, for example, the flow recipe FL1 can be thereby generated by combining the two or more processing recipes among the plurality of processing recipes which are prepared in advance and combining at least one processing recipe with at least one correction formula among the plurality of correction formulas which are prepared in advance, instead of increasing the number of flow recipes FL1 which are prepared in advance. As a result, it is possible, for example, to reduce the amount of data to be used in the substrate processing system 1, the management apparatus 10, the substrate processing apparatus 20, or the like.

The storage control part F03 can store, for example, the information acquired by the information acquisition part F01, the flow recipe FL1 generated by the generation part F02 and the like into the storage part P04. Further, the storage control part F03 can store, for example, the information of the data group Db0 inputted from the management apparatus 10 or the storage medium RM0 into the storage part P04.

The instruction part F04 can perform, for example, various instructions to the schedule management control unit PC1, the plurality of partial control units PC2, and the liquid management control unit PC3. The instruction part F04, for example, can instruct the schedule management control unit PC1 to set a time schedule of transfer and processings on one group of substrates W in the substrate processing apparatus 20, instruct the plurality of partial control units PC2 to perform operations in accordance with the flow recipe FL1 and the time schedule, and instruct the liquid management control unit PC3 to perform temperature control, exchange, monitoring, and the like of the processing liquid L1. The time schedule defines, for example, a timing of transferring the substrate W by the transfer unit 24, a timing of performing processings on the substrates W by the plurality of processing units 21, and the like. The plurality of processing units 21 can thereby perform, for example, processings on the substrates W in accordance with the flow recipes FL1 defining the conditions of the processings to be performed on the substrates W. In the first embodiment, for example, the two or more processing units 21 among the plurality of processing units 21 can perform the same kind of processing on the substrates W in accordance with the same recipe. Herein, the same kind of processing refers to a processing performed by using the same one or more kinds of processing liquids L1 and the sensor part 214 with the same procedure in the processing units 21. Then, for example, even when the time for the liquid processing using the processing liquid L1 is increased or decreased by the correction of the liquid processing recipe R1, the time and the like for the measurement processing using the sensor part 214 and the like is increased or decreased by the correction of the measurement processing recipe R2, only if the processings are performed by using the same one or more kinds of processing liquids L1 and the sensor part 214 with the same procedure in the processing units 21, the processings are regarded as the same kind of processing.

The output control part F05 can visibly or audibly output, for example, the information on the state of the substrate processing apparatus 20 to the output part P03.

The transmission control part F06 can cause, for example, the communication part P01 to transmit various information to the management apparatus 10. Herein, the various information can include, for example, information on a result of the processing performed on one group of substrates W in each carrier C in the substrate processing apparatus 20. Further, the transmission control part F06 can cause, for example, the communication part P01 to transmit the information of the flow recipe FL1 to the schedule management control unit PC1 and the plurality of partial control units PC2.

1-3-6. Schedule Management Control Unit

The schedule management control unit PC1 can set, for example, a time schedule in accordance with the flow recipe FL1 on one group of substrates W stored in the carrier C in response to the instruction from the main body control unit PC0. The time schedule defines, for example, a timing of sequentially transferring the plurality of substrate W constituting one group of substrates W stored in the carrier C by the transfer unit 24 to the plurality of processing units 21 and a timing of performing processings on these plurality of substrates W.

Figure 11A:
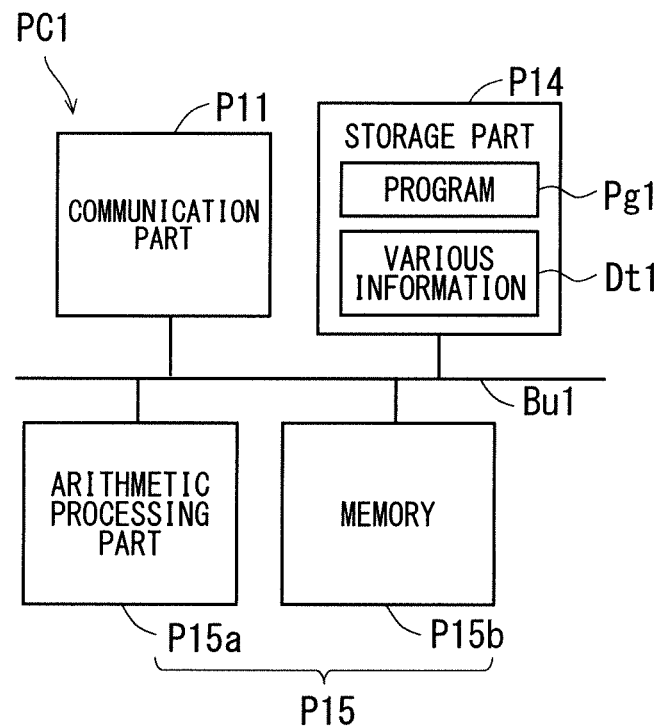
FIGS. 11A and 11B are block diagrams showing an exemplary electrical configuration of a schedule management control unit and an exemplary functional configuration thereof, respectively.

FIG. 11A is a block diagram showing an exemplary electrical configuration of the schedule management control unit PC1. As shown in FIG. 11A, the schedule management control unit PC1 is implemented by, for example, a computer or the like, and includes a communication part P11, a storage part P14, and a control part P15 which are connected to one another via a bus line Bu1.

The communication part P11 has, for example, respective functions as a transmitting part and a receiving part which are capable of transmitting and receiving a signal to/from the main body control unit PC0 and the like via the control communication line L0c and transmitting and receiving data to/from the main body control unit PC0 and the like via the data communication line L0d.

The storage part P14 can store, for example, information therein. This storage part P14 can be formed of, for example, a nonvolatile storage medium such as a hard disk, a flash memory, or the like. As the storage part P14, for example, any one of configurations where one storage medium is formed, where two or more storage media are formed as a unit, and where two or more storage media are formed separately in two or more parts may be adopted. The storage part P14 stores therein, for example, a program Pg1 and various information Dt1. The storage part P14 may include a memory P15b described later.

The control part P15 includes, for example, an arithmetic processing part P15a serving as a processor, a memory P15b for temporarily storing therein information, and the like. As the arithmetic processing part P15a, for example, an electric circuit such as a CPU or the like can be adopted, and as the memory P15b, for example, a RAM or the like can be adopted. The arithmetic processing part P15a can implement the function of the schedule management control unit PC1, for example, by reading and executing the program Pg1 stored in the storage part P14. Various information which are temporarily acquired by various information processings in the control part P15 can be stored in the memory P15b or the like as appropriate.

Figure 11B:
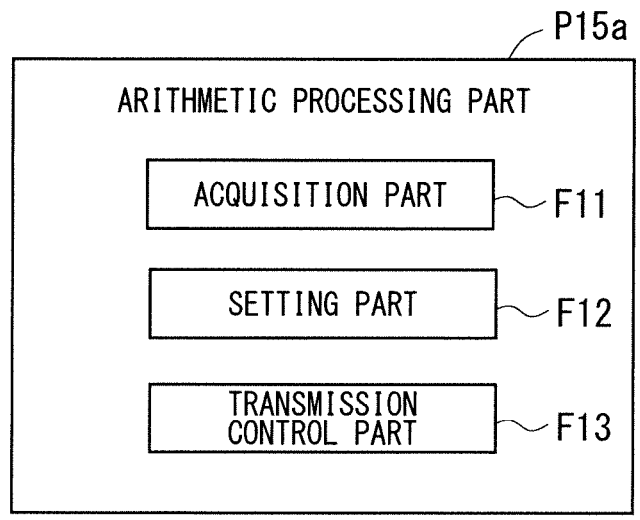

FIG. 11B is a block diagram showing an exemplary functional configuration implemented by the arithmetic processing part P15a. As shown in FIG. 11B, the arithmetic processing part P15a includes, for example, an acquisition part F11, a setting part F12, and a transmission control part F13 as implemented functional constituent elements. As a workspace for the processing in each of these constituent elements, for example, used is the memory P15b. Herein, at least part of the functions implemented by the arithmetic processing part P15a may be implemented by a dedicated electronic circuit.

The acquisition part F11 can acquire, for example, the information of the flow recipe FL1 generated by the main body control unit PC0.

The setting part F12 can set, for example, a time schedule in accordance with the flow recipe FL1 acquired by the acquisition part F11.

The transmission control part F13 can cause, for example, the communication part P11 to transmit various information to the main body control unit PC0. Herein, the various information can include, for example, information of the time schedule set by the setting part F12, and the like.

1-3-7. Partial Control Unit

The plurality of partial control units PC2 can control, for example, respective operations of the plurality of processing units 21 and the transfer unit 24 in accordance with the instruction from the main body control unit PC0. In the first embodiment, a dedicated partial control unit PC2 is provided for each of the processing units 21 and a dedicated partial control unit PC2 is also provided in the transfer unit 24. The partial control unit PC2 in the processing unit 21 can control, for example, respective operations of the constituent elements of the processing unit 21 while monitoring the operations and states of the constituent elements of the processing unit 21 as appropriate. The partial control unit PC2 in the transfer unit 24 can control, for example, respective operations of the constituent elements of the transfer unit 24 while monitoring the operations and states of the constituent elements of the transfer unit 24 as appropriate. Further, herein, for example, one partial control unit PC2 may be provided for two or more processing units 21, or the operation of the transfer unit 24 may be controlled by the main body control unit PC0.

Figure 12A:
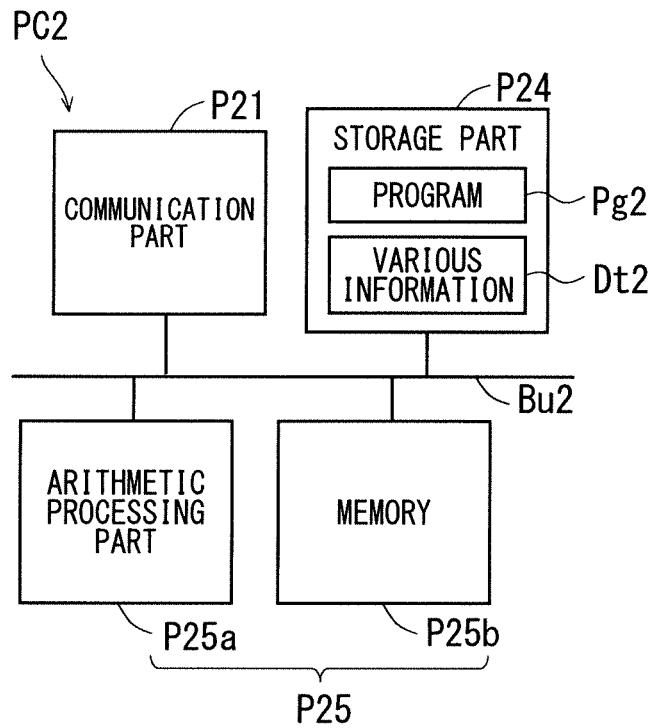
FIGS. 12A and 12B are block diagrams showing an exemplary electrical configuration of a partial control unit and an exemplary functional configuration thereof, respectively.

FIG. 12A is a block diagram showing an exemplary electrical configuration of the partial control unit PC2. As shown in FIG. 12A, the partial control unit PC2 is implemented by, for example, a computer or the like, and includes a communication part P21, a storage part P24, and a control part P25 which are connected to one another via a bus line Bu2.

The communication part P21 has, for example, respective functions as a transmitting part and a receiving part which are capable of transmitting and receiving a signal to/from the main body control unit PC0 and the like via the control communication line L0c and transmitting and receiving data to/from the main body control unit PC0 and the data storage NA1 via the data communication line L0d.

The storage part P24 can store, for example, information therein. This storage part P24 can be formed of, for example, a nonvolatile storage medium such as a hard disk, a flash memory, or the like. As the storage part P24, for example, any one of configurations where one storage medium is formed, where two or more storage media are formed as a unit, and where two or more storage media are formed separately in two or more parts may be adopted. The storage part P24 stores therein, for example, a program Pg2 and various information Dt2. The storage part P24 may include a memory P25b described later.

The control part P25 includes, for example, an arithmetic processing part P25a serving as a processor, a memory P25b for temporarily storing therein information, and the like. As the arithmetic processing part P25a, for example, an electric circuit such as a CPU or the like can be adopted, and as the memory P25b, for example, a RAM or the like can be adopted. The arithmetic processing part P25a can implement the function of the partial control unit PC2, for example, by reading and executing the program Pg2 stored in the storage part P24. Various information which are temporarily acquired by various information processings in the control part P25 can be stored in the memory P25b or the like as appropriate.

Figure 12B:
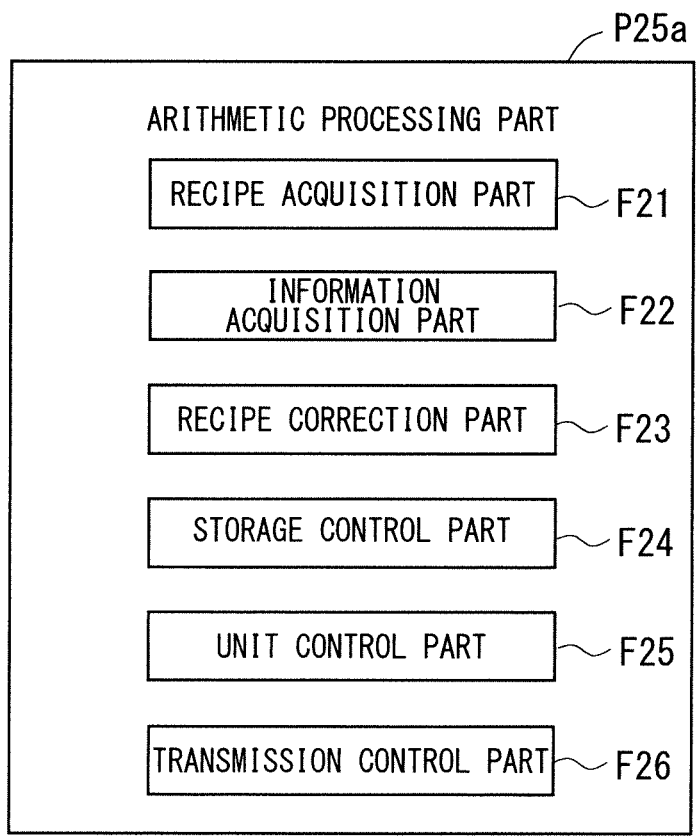

FIG. 12B is a block diagram showing an exemplary functional configuration implemented by the arithmetic processing part P25a. As shown in FIG. 12B, the arithmetic processing part P25a includes, for example, a recipe acquisition part F21, an information acquisition part F22, and a recipe correction part F23, a storage control part F24, a unit control part F25, and a transmission control part F26 as implemented functional constituent elements. As a workspace for the processing in each of these constituent elements, for example, used is the memory P25b. Herein, at least part of the functions implemented by the arithmetic processing part P25a may be implemented by a dedicated electronic circuit.

The recipe acquisition part F21 can acquire, for example, the flow recipe FL1 from the main body control unit PC0.

The information acquisition part F22 can acquire, for example, data relating to one or more kinds of indices on the state of the substrate processing in each of the plurality of processing units 21, which are stored in a data group DG1 of the data storage NA1. This information acquisition part F22 may selectively acquire, for example, data relating to one or more kinds of indices to be used in the recipe correction part F23 from the data group DG1 of the data storage NA1. The data relating to one or more kinds of indices to be used in the recipe correction part F23 can be recognized, for example, by referring to at least one correction formula associated with the processing recipe in the flow recipe FL1.

The recipe correction part F23 can correct, for example, the processing recipe in the flow recipe FL1 by using at least one correction formula associated with this processing recipe. Herein, for example, in response to the signal relating to the index acquired by the sensor parts 22s, 23s, and 214, the recipe correction part F23 can calculate one or more correction coefficients from at least one correction formula in the flow recipe FL1 and correct part of the conditions which is defined by at least one processing recipe associated with the at least one correction formula in this flow recipe FL1 by using the calculated one or more correction coefficients. Herein, the one or more correction coefficients may be one correction coefficient or may be two or more correction coefficients as described earlier. Then, there is a possible case, for example, where at a predetermined timing before one substrate W out of one group of substrates W is processed by one processing unit 21, the recipe correction part F23 corrects the processing recipe on the processing of the one substrate W. The predetermined timing may be, for example, a timing when the processing which is performed on the preceding one other substrate W by using the same processing unit 21 as is used for the processing on the one substrate W is completed. In this case, for example, in response to the completion of the processing on the one substrate W by using the one processing unit 21, the recipe correction part F23 corrects the processing recipe on the next one substrate W.

The storage control part F24 can store, for example, the flow recipe FL1 acquired by the recipe acquisition part F21, the processing recipe after being corrected by the recipe correction part F23 (also referred to as a processing recipe after correction), and one or more correction coefficients calculated by the recipe correction part F23 into the storage part P24. The various information Dt2 in the storage part P24 can thereby include, for example, the flow recipe FL1, the processing recipe after correction, and one or more correction coefficients.

The unit control part F25 can cause, for example, the processing unit 21 to perform a processing on the substrate W on the basis of the flow recipe FL1. Herein, if the recipe correction part F23 corrects the processing recipe, for example, the unit control part F25 causes the processing unit 21 to perform the processing on the substrate W on the basis of the flow recipe FL1 including the processing recipe after correction. Further, the unit control part F25 in the processing unit 21 can control, for example, the operation of the sensor part 214. Furthermore, the unit control part F25 in the transfer unit 24 can control, for example, the operation of the sensor part 22s. The conditions of the respective operations of the sensor part 214 and the sensor part 22s are defined, for example, by the measurement processing recipe. The sensor part 214 and the sensor part 22s can thereby acquire a signal relating to one or more kinds of indices on the state of the substrate processing in the processing unit 21. In this case, the unit control part F25 can acquire, for example, the signal relating to the one or more kinds of indices from the sensor part 214 and the sensor part 22s. Herein, the unit control part F25 may calculate the etching rate as a numerical value based on the signal relating to the one or more kinds of indices, for example, from the film thickness before and after the processing and processing time. The film thickness before the processing, for example, may be the film thickness of the substrate W acquired by the sensor part 214 or may be the film thickness of the substrate W acquired by the main body control unit PC0, from the management apparatus 10. Further, the partial control unit PC2 may calculate, for example, a numerical value indicating the degree of unevenness or the like on the surface of the substrate W, as the numerical value based on the signal relating to the one or more kinds of indices, by performing an image processing on an image signal acquired by the sensor part 214.

The transmission control part F26 can cause, for example, the communication part P21 to transmit various information to the main body control unit PC0 and the data storage NA1. Herein, the various information to be transmitted to the main body control unit PC0 can include, for example, information indicating the completion of the substrate processing, a history (process log) of the processing which is actually performed on the substrate W, information of the recipe after correction which is corrected by the recipe correction part F23, data relating to one or more kinds of indices acquired by using the sensor parts 22s and 214, and the like. Further, the various information to be transmitted to the data storage NA1 can include, for example, data relating to the one or more kinds of indices acquired by using the sensor parts 22s and 214, and the like.

1-3-8. Liquid Management Control Unit

The liquid management control unit PC3 can manage, for example, the state of the processing liquid L1 in the liquid storage unit 23 by controlling respective operations of the constituent elements included in the liquid storage unit 23.

Figure 13A:
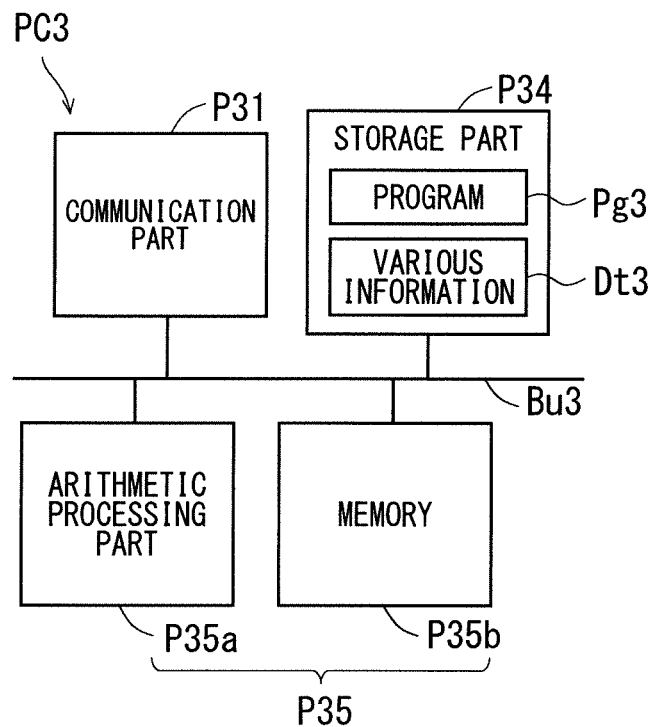
FIGS. 13A and 13B are block diagrams showing an exemplary electrical configuration of a liquid management control unit and an exemplary functional configuration thereof, respectively.

FIG. 13A is a block diagram showing an exemplary electrical configuration of the liquid management control unit PC3. As shown in FIG. 13A, the liquid management control unit PC3 is implemented by, for example, a computer or the like, and includes a communication part P31, a storage part P34, and a control part P35 which are connected to one another via a bus line Bu3.

The communication part P31 has, for example, respective functions as a transmitting part and a receiving part which are capable of transmitting and receiving a signal to/from the main body control unit PC0 and the like via the control communication line L0c and transmitting and receiving data to/from the main body control unit PC0 and the data storage NA1 via the data communication line L0d.

The storage part P34 can store, for example, information therein. This storage part P34 can be formed of, for example, a nonvolatile storage medium such as a hard disk, a flash memory, or the like. As the storage part P34, for example, any one of configurations where one storage medium is formed, where two or more storage media are formed as a unit, and where two or more storage media are formed separately in two or more parts may be adopted. The storage part P34 stores therein, for example, a program Pg3 and various information Dt3. The storage part P34 may include a memory P35b described later.

The control part P35 includes, for example, an arithmetic processing part P35a serving as a processor, a memory P35b for temporarily storing therein information, and the like. As the arithmetic processing part P35a, for example, an electric circuit such as a CPU or the like can be adopted, and as the memory P35b, for example, a RAM or the like can be adopted. The arithmetic processing part P35a can implement the function of the liquid management control unit PC3, for example, by reading and executing the program Pg3 stored in the storage part P34. Various information which are temporarily acquired by various information processings in the control part P35 can be stored in the memory P35b or the like as appropriate.

Figure 13B:
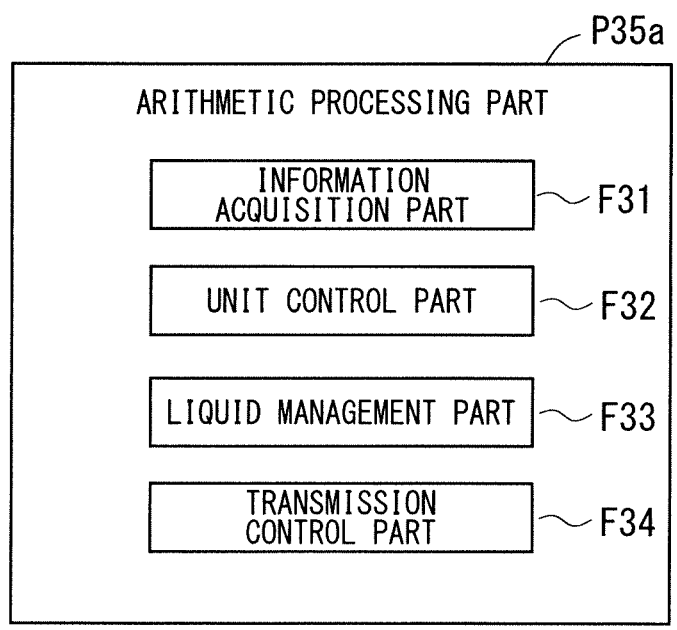

FIG. 13B is a block diagram showing an exemplary functional configuration implemented by the arithmetic processing part P35a. As shown in FIG. 13B, the arithmetic processing part P35a includes, for example, an information acquisition part F31, a unit control part F32, and a liquid management part F33, and a transmission control part F34 as implemented functional constituent elements. As a workspace for the processing in each of these constituent elements, for example, used is the memory P35b. Herein, at least part of the functions implemented by the arithmetic processing part P35a may be implemented by a dedicated electronic circuit.

The information acquisition part F31 can acquire, for example, various instructions from the main body control unit PC0. The various instructions include, for example, instructions to perform temperature control, exchange, monitoring, and the like of the processing liquid L1.

The unit control part F32 can control, for example, the operation of the liquid storage unit 23. The unit control part F32 can cause, for example, the sensor part 23s of each storage tank 23t to acquire a signal relating to the physical quantity indicating a state of the processing liquid L1. The sensor part 23s can thereby acquire a signal relating to one or more kinds of indices on the state of the substrate processing in the processing unit 21. Further, the unit control part F32 can cause, for example, a heating part HR to heat the processing liquid L1 in each storage tank 23t. Further, in a case where each storage tank 23t includes a liquid exchange part for automatically exchanging the processing liquid L1, for example, the unit control part F32 can cause the liquid exchange part to exchange the processing liquid L1 in each storage tank 23t.

The liquid management part F33 can manage, for example, elapsed time since the liquid exchange of the processing liquid L1 in each storage tank 23t and the number of uses of the processing liquid L1. The elapsed time can be recognized, for example, by the function of a clock with the time of the latest exchange of the processing liquid L1 as a reference, to be managed. The number of uses of the processing liquid L1 can be recognized, for example, on the basis of the amount of processing liquid L1 stored in each storage tank 23t and the amount of processing liquid L1 supplied from each storage tank 23t to the plurality of processing units 21, to be managed.

The transmission control part F34 can cause, for example, the communication part P31 to transmit various information to the main body control unit PC0 and the data storage NA1. Herein, the various information to be transmitted to the main body control unit PC0 include, for example, information of the elapsed time since the liquid exchange of the processing liquid L1 in each storage tank 23t and the number of uses of the processing liquid L1, and the like. The various information to be transmitted to the data storage NA1 include, for example, information on one or more kinds of indices acquired by using the sensor part 23s, the information of the elapsed time since the liquid exchange of the processing liquid L1 in each storage tank 23t and the number of uses of the processing liquid L1, and the like.

1-3-9. Data Storage

The data storage NA1 can store therein, for example, the data group DG1 relating to one or more kinds of indices on the state of the substrate processing in each of the plurality of processing units 21 on the basis of a signal acquired by each of the sensor parts 22s, 23s, and 214. The data group DG1 may also include, for example, the information of the elapsed time since the liquid exchange of the processing liquid L1 in each storage tank 23t and the number of uses of the processing liquid L1, which is transmitted from the liquid management control unit PC3, as the data relating to the one or more kinds of indices on the state of the substrate processing in each of the plurality of processing units 21. As the data storage NA1, for example, a nonvolatile storage medium such as a hard disk, a flash memory, or the like may be applied or a volatile storage medium such as a RAM or the like may be applied.

Figure 14:
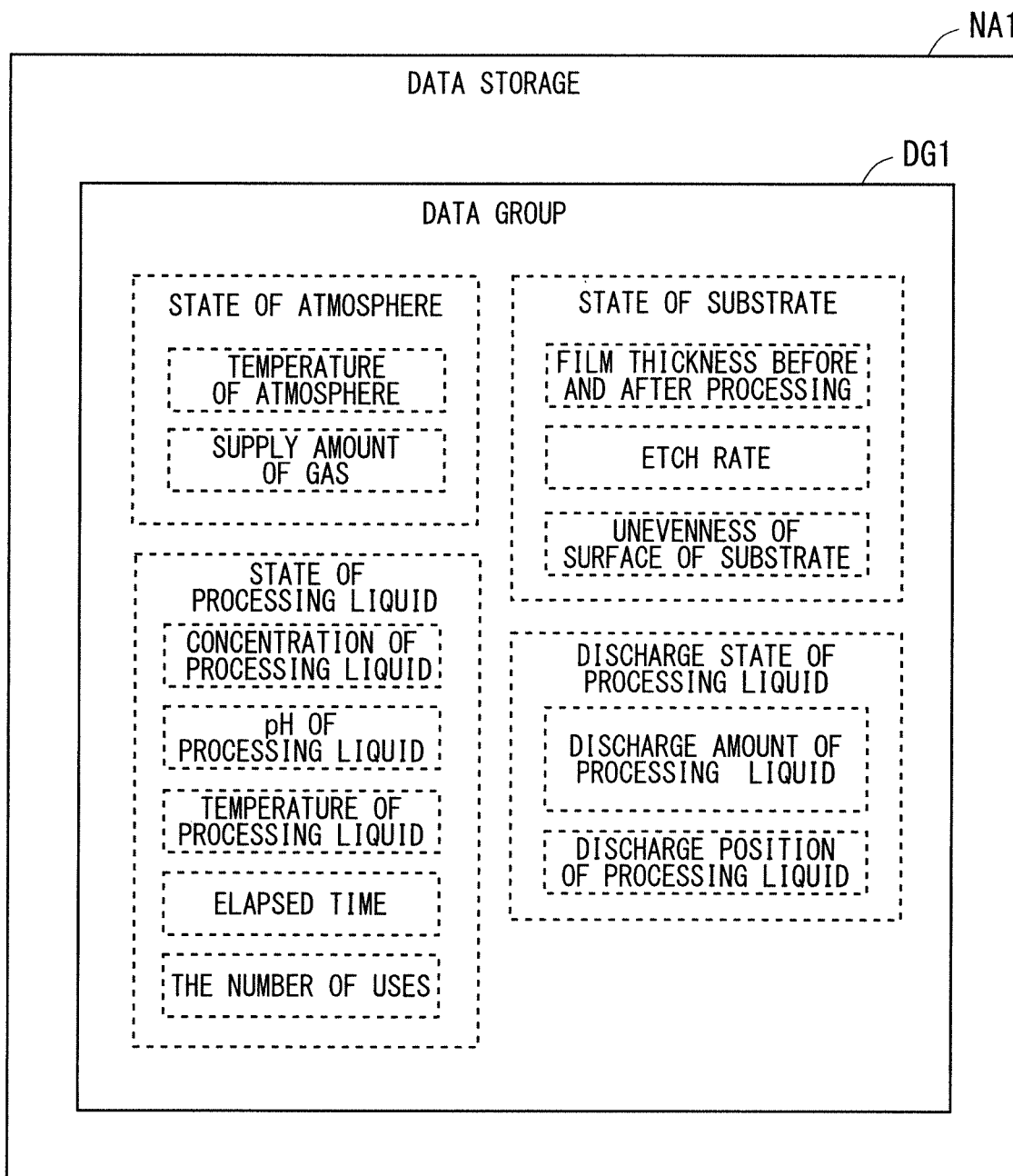
FIG. 14 is a diagram showing exemplary contents of the data group stored in a data storage.

FIG. 14 is a diagram showing exemplary contents of the data group DG1 stored in the data storage NA1. As shown in FIG. 14, the data group DG1 can include, for example, a numerical value of an index indicating the state of an atmosphere in the internal space Sc0 (e.g., the temperature of the atmosphere, the amount of supplied gas, or the like), a numerical value of an index indicating the state of the processing liquid L1 (e.g., the concentration, the pH, the temperature, the elapsed time since liquid exchange, the number of uses of the processing liquid L1, or the like), a numerical value of an index relating to the state of the substrate W (e.g., the film thickness before and after the processing, the etch rate, the degree of unevenness on the surface of the substrate), and the like. Further, the data group DG1 may include, for example, a numerical value of an index indicating the state of discharge of the processing liquid L1 (e.g., the amount of discharge, the discharge position, and the like). Herein, in the data storage NA1, for example, various data included in the data group DG1 are overwritten, to be the data relating to the latest index. Further, the various data included in the data group DG1 may include, for example, data indicating which of the sensor parts 22s, 23s, and 214 in which of the parts (the processing units 21, the storage tanks 23t, or the like) acquires the index.

1-4. Flow Recipe Generation Operation

Figure 15:
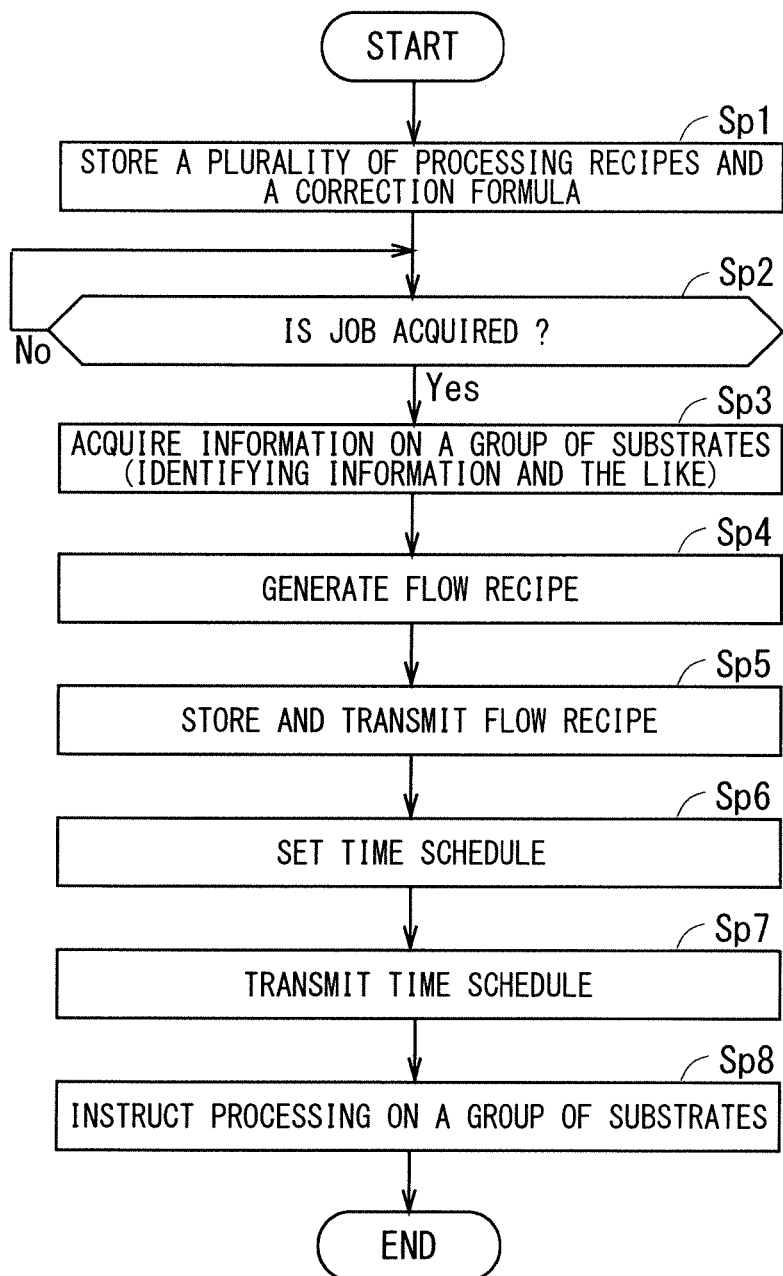
FIG. 15 is a flowchart showing an example of an operation flow relating to generation of the flow recipe.

FIG. 15 is a flowchart showing an example of an operation flow relating to generation of the flow recipe FL1. Herein, for example, when the arithmetic processing part P05a of the main body control unit PC0 executes the program Pg0 and the arithmetic processing part P15a of the schedule management control unit PC1 executes the program Pg1, an operation flow shown in FIG. 15, relating to generation of the flow recipe FL1, is achieved in cooperation between the main body control unit PC0 and the schedule management control unit PC1.

In Step Sp1 of FIG. 15, first, the storage control part F03 of the main body control unit PC0 stores a plurality of processing recipes each defining a processing condition relating to a processing to be performed on the substrate W in the plurality of processing units 21 and correction formula, into the storage part P04. The data group Db0 is thereby stored into the storage part P04. Herein, the plurality of processing recipes include, for example, a plurality of liquid processing recipes R1 each defining a condition of a processing to be performed on the substrate W by using the processing liquid L1.

In Step Sp2, the information acquisition part F01 of the main body control unit PC0 determines whether or not a job is acquired form the management apparatus 10. Herein, the information acquisition part F01 repeats the determination in Step Sp2, for example, until a job on a group of substrates W stored in a carrier C is acquired from the management apparatus 10 in response to placement of the carrier C in which the group of substrates W is stored, on the load port LP. Then, when the information acquisition part F01 acquires the job, the process goes to Step Sp3.

In Step Sp3, the information acquisition part F01 of the main body control unit PC0 acquires information on the group of substrates W, which includes two or more pieces of identifying information and the information on each substrate W, in accordance with the job acquired in Step Sp2, from the management apparatus 10. The two or more pieces of identifying information can include recipe identifying information for identifying a liquid processing recipe relating to the liquid processing and a measurement processing recipe relating to the measurement processing, respectively, and correction formula identifying information for identifying a correction formula relating to the correction processing.

In Step Sp4, the generation part F02 of the main body control unit PC0 generates the flow recipe FL1. Herein, the flow recipe FL1 is generated, for example, by combining two or more processing recipes among the plurality of processing recipes stored into the storage part P04 in Step Sp1. These two or more processing recipes correspond to, for example, the two or more pieces of identifying information acquired in Step Sp3 among the data group Db0 stored in the storage part P04. Herein, when the two or more pieces of identifying information acquired in Step Sp3 include the correction formula identifying information, the flow recipe FL1 may be generated by combining the correction formula corresponding to this correction formula identifying information among the data group Db0 stored in the storage part P04 with the processing recipe.

In Step Sp5, the storage control part F03 of the main body control unit PC0 stores the flow recipe FL1 generated in Step Sp4 into the storage part P04 and the transmission control part F06 of the main body control unit PC0 causes the communication part P01 to transmit the flow recipe FL1 generated in Step Sp4 to the schedule management control unit PC1.

In Step Sp6, the setting part F12 of the schedule management control unit PC1 sets a time schedule in accordance with the flow recipe FL1 generated in Step Sp4.

In Step Sp7, the transmission control part F13 of the schedule management control unit PC1 causes the communication part P11 to transmit information of the time schedule set in Step Sp6 to the main body control unit PC0.

In Step Sp8, the instruction part F04 of the main body control unit PC0 instructs the plurality of partial control units PC2 to perform operations in accordance with the flow recipe FL1 and the time schedule. At that time, the plurality of processing units 21 perform the processings on the substrates W in accordance with the flow recipe FL1 generated in Step Sp4. The processings on the group of substrates W are thereby performed in accordance with the time schedule and the flow recipe FL1.

Through such an operation flow, for example, even if the conditions of the series of processings to be performed on the substrates W increase, the flow recipe FL1 can be generated by combining the two or more processing recipes among the plurality of processing recipes which are prepared in advance, instead of increasing the number of flow recipes which are prepared in advance. It is thereby possible, for example, to reduce the amount of data which are prepared in advance in the substrate processing system 1, the substrate processing apparatus 20, or the like. As a result, it is possible, for example, to reduce the amount of data to be used in the substrate processing system 1, the management apparatus 10, the substrate processing apparatus 20, or the like.

1-5. Processing Recipe Correction Operation

Figure 16:
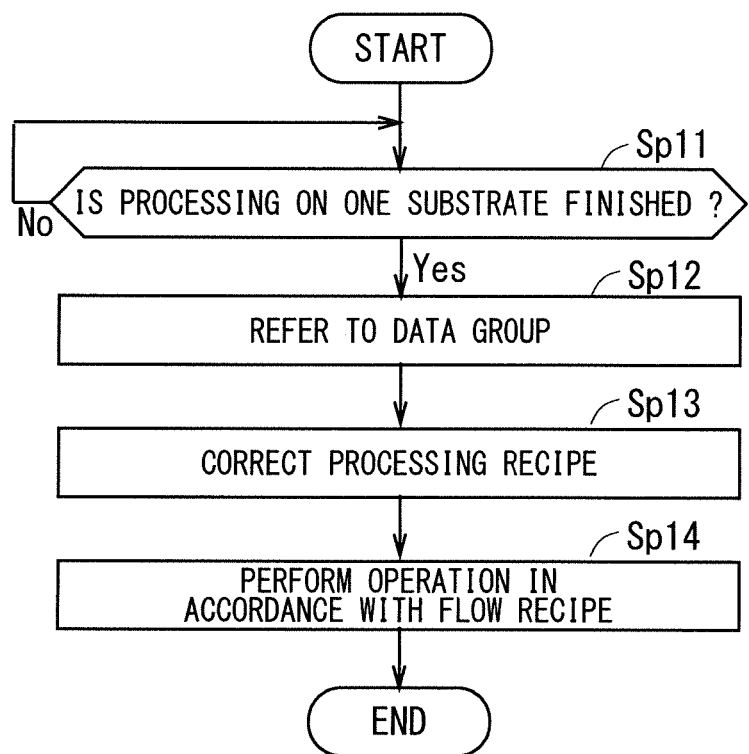
FIG. 16 is a flowchart showing an example of an operation flow relating to correction of a processing recipe.

FIG. 16 is a flowchart showing an example of an operation flow relating to correction of the processing recipe. Herein, for example, the arithmetic processing part P25a of the partial control unit PC2 in the processing unit 21 executes the program Pg2, to thereby achieve an operation flow relating to correction of the processing recipe.

In Step Sp11 of FIG. 16, first, the unit control part F25 of the partial control unit PC2 determines whether or not the processing on one substrate W in the processing unit 21 is finished. Herein, the unit control part F25 repeats the determination in Step Sp11, for example, until the processing on one substrate W in accordance with the flow recipe FL1 in the processing unit 21 is finished. Then, when the processing on one substrate W in accordance with the flow recipe FL1 in the processing unit 21 is finished, the unit control part F25 causes the process to go to Step Sp12.

In Step Sp12, the information acquisition part F22 of the partial control unit PC2 acquires data relating to one or more kinds of indices on the state of substrate processing in each of the plurality of processing units 21, from the data storage NA1. Herein, for example, in accordance with the correction formula associated with the processing recipe of the flow recipe FL1, the data relating to one or more kinds of indices needed for the correction of the processing recipe can be acquired from the data storage NAL.

In Step Sp13, the recipe correction part F23 of the partial control unit PC2 corrects one or more processing recipes included in the flow recipe FL1 on one substrate W which is to be processed in the processing unit 21 next to the substrate W on which the processing in the same processing unit 21 is finished in Step Sp11. Herein, the recipe correction part F23 corrects, for example, the one or more processing recipes included in the flow recipe FL1 on the basis of the correction formula associated with this one or more processing recipes and the data relating to the one or more kinds of indices acquired in Step Sp12. It is thereby possible, for example, to correct the processing recipe for each substrate W in almost real time when the plurality of processing units 21 sequentially perform the processings on one group of substrates W.

In Step Sp14, the unit control part F25 of the partial control unit PC2 in the processing unit 21 causes the processing unit 21 to perform an operation in accordance with the flow recipe FL1. Herein, if the processing recipe is corrected in Step Sp13 in the flow recipe FL1 shown in FIG. 10, for example, the unit control part F25 causes the processing unit 21 to perform the operation in accordance with the flow recipe FL1 including one or more processing recipes corrected in Step Sp13.

Herein, when the processing unit 21 performs the processing on the substrate W in accordance with the flow recipe FL1, for example, in a case where the signal relating to one or more kinds of indices indicating the state of the substrate W, which are acquired by the sensor part 214, satisfies a predetermined condition, the transmission control part F26 of the arithmetic processing part P25a in the partial control unit PC2 causes the communication part 21 to transmit information (also referred to as combination information) indicating a combination of the processing recipe and the correction formula in the flow recipe FL1, to the main body control unit PC0. Then, the transmission control part F06 of the arithmetic processing part P05a in the main body control unit PC0 causes the communication part P01 as the second communication part to transmit this combination information to the management apparatus 10.

Herein, as the predetermined condition, for example, applied is a condition to be achieved in the one or more kinds of indices indicating the state of the substrate W by performing the processing on the substrate W in accordance with the flow recipe FL1 in the processing unit 21. Specifically, in a case where the processing in accordance with the flow recipe FL1 is performed on the substrate W to make the film thickness of the substrate W smaller than a predetermined target value by the etching processing, for example, a condition that the film thickness which is one kind of index indicating the state of the substrate W is smaller than the predetermined target value is adopted as the predetermined condition. Then, in a case where the processing unit 21 performs the processing on the substrate W in accordance with the flow recipe FL1 shown in FIG. 10, for example, when the film thickness of the substrate W which is acquired by the measurement processing in accordance with the last second measurement processing recipe R2b is smaller than the predetermined target value, the signal relating to the one or more kinds of indices indicating the state of the substrate W, which is acquired by the sensor part 214, satisfies the predetermined condition.

When such a configuration is adopted, for example, if the processing based on the processing recipe combined with the correction formula produces an excellent result, by transmitting the combination information indicating the combination of the processing recipe and the correction formula to the management apparatus 10, it becomes possible to use the combination of the processing recipe and the correction formula, which produces an excellent result, also in another substrate processing apparatus 20.

1-6. Summary of the First Embodiment

Thus, in the substrate processing system 1 and the substrate processing apparatus 20 according to the first embodiment, for example, by combining two or more processing recipes among the plurality of processing recipes including the plurality of liquid processings, the flow recipe FL1 is generated. For this reason, for example, even if the conditions of the series of processings to be performed on the substrate W increase, the flow recipe FL1 can be generated by combining two or more processing recipes among the plurality of processing recipes which are prepared in advance, instead of increasing the number of flow recipes which are prepared in advance. At that time, for example, the generation part F02 can generate the flow recipe FL1 by combining two or more processing recipes corresponding to two or more pieces of identifying information from the management apparatus 10. It is thereby possible, for example, to reduce the amount of data which are prepared in advance in the substrate processing system 1, the management apparatus 10, the substrate processing apparatus 20, or the like. As a result, it is possible, for example, to reduce the amount of data to be used in the substrate processing system 1, the management apparatus 10, the substrate processing apparatus 20, or the like.

1-7. Other Embodiments

The present invention is not limited to the above-discussed first embodiment but numerous modifications and variations can be devised without departing from the scope of the invention.

1-7-1. The Second Embodiment

In the above-described first embodiment, for example, such a flow recipe FL1 as to branch the processing flow in accordance with the state of the one substrate W, in the processing performed on one substrate W in accordance with the flow recipe FL1 in the processing unit 21, may be generated.

In this case, for example, the sensor part 214 can acquire a signal relating to one or more kinds of indices indicating the state of the substrate W. This one or more kinds of indices can include, for example, the film thickness of the substrate W. Further, the plurality of measurement processing recipes R2 of the measurement processing recipe group Gp2 include, for example, the first measurement processing recipe R2a defining a condition of the measurement processing performed by the sensor part 214 in order to acquire the signal relating to the one or more kinds of indices indicating the state of the substrate W. The data group Db0 includes, for example, a branch processing recipe group Gp4.

Figure 17:
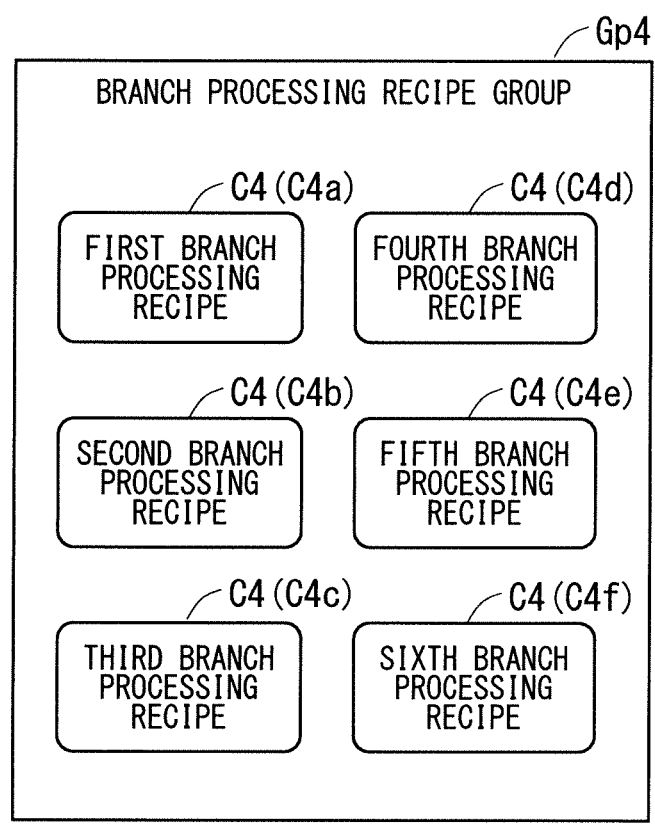
FIG. 17 is a diagram showing an example of a branch processing recipe group included in a data group according to a second embodiment.

FIG. 17 is a diagram showing an example of the branch processing recipe group Gp4 included in the data group Db0 according to the second embodiment. The branch processing recipe group Gp4 includes, for example, a plurality of branch processing recipes C4 for branching the processing flow. In the exemplary case shown in FIG. 17, the plurality of branch processing recipes C4 include a first branch processing recipe C4a, a second branch processing recipe C4b, a third branch processing recipe C4c, a fourth branch processing recipe C4d, a fifth branch processing recipe C4e, and a sixth branch processing recipe C4f. Specifically, as the plurality of branch processing recipes C4, for example, applied is a recipe defining a condition of a processing (also referred to as a branch processing) for performing a first processing flow (also referred to as a first after-branch processing flow) when the one or more kinds of indices indicating the state of the substrate W satisfy a first condition and performing a second processing flow (also referred to as a second after-branch processing flow) when the one or more kinds of indices indicating the state of the substrate W satisfy a second condition. Herein, considered is a case, for example, where one of the one or more kinds of indices indicating the state of the substrate W is the film thickness of the substrate W. In this case, there is a possible case where the first condition is that the film thickness is smaller than T1 micrometers (μm) and the second condition is that the film thickness is not smaller than T1 μm. Further, the branch processing recipe C4 may be, for example, a recipe for performing a third processing flow (also referred to as a third after-branch processing flow) when the one or more kinds of indices indicating the state of the substrate W satisfy a third condition. Herein, there is a possible case where the first condition is that the film thickness is smaller than T1 μm, the second condition is that the film thickness is not smaller than T1 μm and smaller than T2 μm, and the third condition is that the film thickness is not smaller than T2 μm and smaller than T3 μm.

Then, the generation part F02 can generate the flow recipe FL1, for example, by combining the first measurement processing recipe R2a among the plurality of measurement processing recipes R2 and the branch processing recipe C4 among the plurality of branch processing recipes C4, which defines a condition of the branch processing for performing the first after-branch processing flow when the one or more kinds of indices satisfy the first condition and performing the second after-branch processing flow when the one or more kinds of indices satisfy the second condition while combining this branch processing recipe C4 with a first processing recipe as the processing recipe for the first after-branch processing flow and combining this branch processing recipe C4 with a second processing recipe different from the first processing recipe, as the processing recipe for the second after-branch processing flow.

Figure 18:
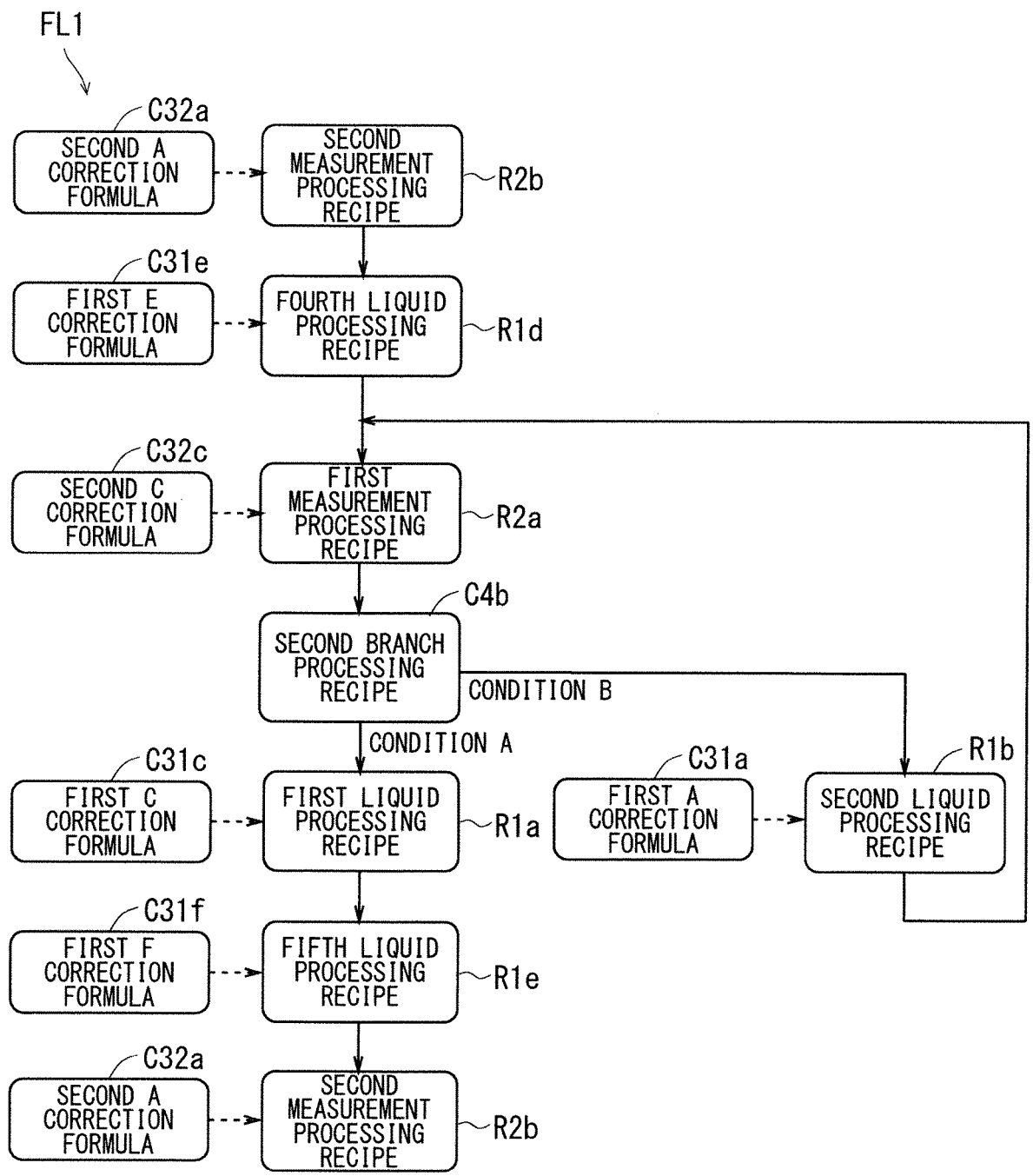
FIG. 18 is a diagram showing an example of a flow recipe according to the second embodiment.

FIG. 18 is a diagram showing an example of the flow recipe FL1 according to the second embodiment. In the flow recipe FL1 shown in FIG. 18, for example, the flow recipe FL1 shown in FIG. 10 is used as a base and the first measurement processing recipe R2a combined with the second C correction formula C32c and the second branch processing recipe C4b are inserted, in this order of description, between the fourth liquid processing recipe R1d and the first liquid processing recipe R1a, and the second branch processing recipe C4b causes the first after-branch processing flow to be performed when the one or more kinds of indices indicating the state of the substrate W as the result of the measurement processing performed by the sensor part 214 in accordance with the first measurement processing recipe R2a satisfy a condition A as the first condition and causes the second after-branch processing flow to be performed when the one or more kinds of indices indicating the state of the substrate W as the result of the measurement processing performed by the sensor part 214 in accordance with the first measurement processing recipe R2a satisfy a condition B as the second condition.

In the exemplary case shown in FIG. 18, the first after-branch processing flow is formed by combining the first liquid processing recipe R1a combined with the first C correction formula C31c, the fifth liquid processing recipe R1e combined with the first F correction formula C31f, and the second measurement processing recipe R2b combined with the second A correction formula C32a in this order of description. In other words, the second branch processing recipe C4b is combined with the first liquid processing recipe R1a as the first processing recipe, as the processing recipe of the first after-branch processing flow. Further, the second after-branch processing flow is formed so that after the liquid processing in accordance with the second liquid processing recipe R1b combined with the first A correction formula C31a is performed, the measurement processing in accordance with the first measurement processing recipe R2a is performed again. In other words, the second branch processing recipe C4b is combined with the second liquid processing recipe R1b as the second processing recipe, as the processing recipe of the second after-branch processing flow. According to the processing in accordance with the flow recipe FL1 including the branch processing recipe C4, for example, the second after-branch processing flow is repeatedly performed until the one or more kinds of indices indicating the state of the substrate W satisfy the condition A as the first condition, and when the one or more kinds of indices indicating the state of the substrate W satisfy the condition A as the first condition, the first after-branch processing flow is performed.

Herein, for example, one of the one or more kinds of indices indicating the state of the substrate W is the film thickness of the film on the substrate W to be etched, and if the condition A as the first condition is that the film thickness is smaller than T1 μm, the second after-branch processing flow is repeatedly performed so that the etching processing on the substrate W is performed until the one or more kinds of indices indicating the state of the substrate W satisfy the condition A. Herein, there is a possible case, for example, where the second liquid processing recipe R1b defines such a condition of the processing as the amount of etching of the film on the substrate W is relatively lower, as compared with the condition defined by the fourth liquid processing recipe R1d. Specifically, there is a possible case, for example, where the second liquid processing recipe R1b defines such a condition of the processing as at least the concentration of an etching solution as the processing liquid L1 is relatively lower or the time for etching processing is relatively shorter, as compared with the condition defined by the fourth liquid processing recipe R1d. When such a configuration is adopted, for example, the processing on the substrate W is unlikely to be insufficient in the substrate processing apparatus 20, and it is possible to increase the efficiency of the processing of the substrate W, as compared with a case where insufficiently-processed substrates W in the carrier C are once unloaded from the substrate processing apparatus 20 and then the substrates W are processed again in the substrate processing apparatus 20 or the like in order to solve the processing insufficiency of the substrates W.

Thus, in the substrate processing system 1 and the substrate processing apparatus 20 according to the second embodiment, for example, the generation part F02 can generate the flow recipe FL1 by which the processing in accordance with the state of the substrate W can be performed on the substrate W by combining the first measurement processing recipe R2a, the second branch processing recipe C4b, the first processing recipe relating to the first after-branch processing flow, and the second processing recipe relating to the second after-branch processing flow. Even if the conditions of the series of processings to be performed on the substrate W increase so that the processing flow can be branched in accordance with the state of the substrate W, for example, the flow recipe FL1 defining the series of processings on the substrate W so that the state of the substrate W may approximate to a desired state can be thereby generated by combining the first measurement processing recipe R2a among the plurality of measurement processing recipes R2 which are prepared in advance, one branch processing recipe C4 among the plurality of branch processing recipes C4 which are prepared in advance, and the first liquid processing recipe R1a and the second liquid processing recipe R1b among the plurality of liquid processing recipes R1 which are prepared in advance, instead of increasing the number of flow recipes FL1 which are prepared in advance. As a result, it is possible, for example, to reduce the amount of data which are prepared in advance in the substrate processing system 1, the substrate processing apparatus 20, or the like and it is thereby possible, for example, to reduce the amount of data to be used in the substrate processing system 1, the management apparatus 10, the substrate processing apparatus 20, or the like. Further, for example, it is possible to easily increase the efficiency of the processing to be performed on the substrate W, as compared with a case where after the substrate W is unloaded from the substrate processing apparatus 20, the substrate W is processed again in the substrate processing apparatus 20 in order to make the state of the substrate W approximate to the desired state.

In the second embodiment, when the processing in accordance with the flow recipe FL1 is performed on the substrate W by the processing unit 21, for example, in the branch processing in accordance with the second branch processing recipe C4b which is performed a preset number of (e.g., one) times or less, if one or more kinds of indices indicating the state of the substrate W, as the result of the measurement processing performed by the sensor part 214 in accordance with the first measurement processing recipe R2a, satisfy the condition A as the first condition, the signal relating to the one or more kinds of indices indicating the state of the substrate W, which is acquired by the sensor part 214, may be determined to satisfy the predetermined condition. In this case, the transmission control part F26 of the arithmetic processing part P25a in the partial control unit PC2 may cause the communication part P21 to transmit the combination information indicating the combination of the fourth liquid processing recipe R1d as the processing recipe in the flow recipe FL1 and the first E correction formula C31e combined with the fourth liquid processing recipe R1d, to the main body control unit PC0. Then, the transmission control part F06 of the arithmetic processing part P05a in the main body control unit PC0 may cause the communication part P01 as the second communication part to transmit this combination information to the management apparatus 10. When such a configuration is adopted, for example, if the processing based on the processing recipe combined with the correction formula produces an excellent result, by transmitting the combination information indicating the combination of the processing recipe and the correction formula to the management apparatus 10, it becomes possible to use the combination of the processing recipe and the correction formula, which produces an excellent result, also in another substrate processing apparatus 20.

1-7-2. The Third Embodiment

In the above-described embodiments, for example, one liquid processing recipe R1 may define a condition of the liquid processings using two or more kinds of processing liquids L1 and define a condition for branching the processing flow so that in accordance with the processing-relevant state of the substrate W in the processing unit 21, contents of one or more liquid processings which are to be performed afterward are changed.

Specifically, the plurality of liquid processing recipes R1 included in the data group Db0 may include, for example, one or more liquid processing recipes (also referred to as structured liquid processing recipes) each defining a processing flow and a condition in which if it is in a first state while a processing (also referred to as a first liquid processing) using the first processing liquid L11 is performed on a substrate W, a processing (also referred to as a second liquid processing) using the second processing liquid L12 is performed on the substrate W after the first liquid processing is performed and in response to the change of the first state to a second state, which is made while the first liquid processing is performed on the substrate W, a processing (also referred to as a third liquid processing) using the third processing liquid L13 is performed on the substrate W. When such a configuration is adopted, for example, in a case where the first liquid processing using the first processing liquid L11 and the second liquid processing using the second processing liquid L12 are sequentially performed on the substrate W, when it becomes the specific second state while the first liquid processing is performed on the substrate W, the first liquid processing performed on the substrate W is finished and the third liquid processing can be performed on the substrate W. It is thereby possible, for example, to perform an appropriate processing according to the situation at the time while the first liquid processing is performed on the substrate W.

FIG. 19 is a flowchart showing an example of the liquid processing recipe R1 as a structured liquid processing recipe which is defined so that the plurality of liquid processings are structured, according to the third embodiment. The liquid processing recipe R1 shown in FIG. 19 defines a condition of a processing in which when a predetermined processing time has elapsed in a state where the first state is maintained since the first liquid processing on the substrate W starts, the second liquid processing and the third liquid processing are performed on the substrate W in this order of description after the first liquid processing is finished while when the first state is changed to the second state in mid-course of the first liquid processing performed on the substrate W, the third liquid processing is performed on the substrate W. Herein, for example, as the first state, applied is a state where the first processing liquid L11 is stored in the storage tank 23*t*, and as the second state, applied is a state (also referred to as a non-suppliable state) where the first processing liquid L11 cannot be supplied from the storage tank 23*t* to the processing unit 21. The non-suppliable state includes, for example, a state (exhausted state) where the first processing liquid L11 stored in the storage tank 23*t* is exhausted, and the like. In this case, for example, there is a possible configuration in which the sensor part 23*s* detects the amount of first processing liquid L11 in the storage tank 23*t*.

Herein, specifically, considered is, for example, a case where the first processing liquid L11 is an etching solution such as nitrohydrofluoric acid which is a mixture of hydrofluoric acid and nitric acid, or the like, the second processing liquid L12 is a chemical liquid such as an SC1 solution or the like, and the third processing liquid L13 is a solution for rinse processing, such as pure water or the like. In this case, for example, in response to the state change to the second state where nitrohydrofluoric acid which is the first processing liquid L11 is exhausted while the first liquid processing is performed, if the first liquid processing is simply stopped and the substrate W is unloaded from the processing unit 21, the substrate W can be overetched by the nitrohydrofluoric acid left on the substrate W. On the other hand, for example, in response to the state change to the second state where nitrohydrofluoric acid which is the first processing liquid L11 is exhausted while the first liquid processing is performed, if the nitrohydrofluoric acid left on the substrate W is rinsed off by using the third processing liquid L13 which is the solution for rinse processing, such as pure water or the like, such a trouble as the overetching of the substrate W by the nitrohydrofluoric acid left on the substrate W is unlikely caused.

1-7-3. Other Embodiments

In the above-described embodiments, as shown in FIG. 20, for example, the generation part F02 may generate the flow recipe FL1 by combining one or more liquid processing recipes R1 and two or more measurement processing recipes R2 among the plurality of processing recipes included in the data group Db0. Further, the generation part F02 may generate the flow recipe FL1, for example, by combining one or more liquid processing recipes R1 and one or more measurement processing recipes R2 among the plurality of processing recipes included in the data group Db0.

In the above-described embodiments, all or part of the data constituting the data group Db0 stored in the storage part P04 in the main body control unit PC0, for example, may be stored in at least one of the storage parts P04, P14, P24, and P34 of the substrate processing apparatus 20, or may be stored dispersedly in two or more of the storage parts P04, P14, P24, and P34 of the substrate processing apparatus 20. Further, all or part of the data constituting the data group Db0 stored in the storage part P04 in the main body control unit PC0 may be stored, for example, in the storage part 14 of the management apparatus 10. In other words, at least part of apparatuses among the plurality of substrate processing apparatuses 20 and the management apparatus 10 may include, for example, one or more storage parts storing therein the plurality of processing recipes which define respective processing conditions relating to the processings to be performed on the substrates W in one or more processing units 21.

In the above-described embodiments, for example, a position of the film on the substrate W, at which the film thickness is measured by the film thickness meter Fm0 may be made recognizable, by detecting an angle of the arm part Am1 of the film thickness meter Fm0 using sensor part 214. In this case, for example, if the measurement processing recipe R2 defines a condition of measuring the thickness (film thickness) of the film on the substrate W by using the film thickness meter Fm0, the second correction formula C32 to be combined with the measurement processing recipe R2 may be used for the correction processing for appropriately changing the position of the film on the substrate W, at which the film thickness is measured by the film thickness meter Fm0.

In the above-described embodiments, the correction of the liquid processing recipe R1 with the first correction formula C31 is not limited to the correction of the etching time such as the supply time of the etching solution or the like but may include, for example, the correction of the other conditions such as a condition of appropriately modifying and changing the discharge position at which the nozzles Nz1 and Nz2 discharge the processing liquid L1 toward the substrate W, or the like.

In the above-described embodiments, in a case where a plurality of processings having conditions defined by the flow recipe FL1 are performed by sequentially using two or more processing units 21, for example, information of part of the processing recipes in the flow recipe FL1 may be transmitted to the respective partial control units PC2 of the two or more processing units 21.

In the above-described embodiments, the measurement processing in accordance with the last measurement processing recipe after all the liquid processing recipes in the flow recipe FL1 may be, for example, a measurement processing performed by the sensor part positioned outside the processing unit 21.

Tough the substrate processing apparatus 20 acquires two or more pieces of identifying information for identifying the processing recipe or the like from the management apparatus 10 in the above-described embodiments, this is only one exemplary case. The substrate processing apparatus 20 may acquire, for example, two or more pieces of identifying information from one or more parts such as other apparatuses connected thereto via the communication line 5, the storage medium RM0 held by the drive 16, the input part P02, or the like.

In the above-described embodiments, for example, the data group DG1 stored in the data storage NA1 may be stored in at least one of the storage part P04 of the main body control unit PC0, the storage part P14 of the schedule management control unit, and the storage part P24 of the partial control unit PC2, or may be stored in the storage part 14 of the management apparatus 10. In this case, for example, apart from the management apparatus 10, a server in which at least one of the data group Db0 and the data group DG1 is stored may be connected to each of the substrate processing apparatuses 20 so as to be capable of transmitting and receiving data via the communication line 5.

In the above-described embodiments, the generation of the flow recipe FL1 may be performed, for example, in at least one of the arithmetic processing part P05a of the main body control unit PC0 and the arithmetic processing part P15a of the schedule management control unit PC1, or may be performed in cooperation between the arithmetic processing part P05a of the main body control unit PC0 and the arithmetic processing part P15a of the schedule management control unit PC1. Further, for example, the functions of the main body control unit PC0 and the schedule management control unit PC1 may be implemented by one control unit. In other words, the function of the arithmetic processing part P05a of the main body control unit PC0 and the function of the arithmetic processing part P15a of the schedule management control unit PC1 may be allocated as appropriate to one or more arithmetic processing parts of one or more control units.

In the above-described embodiments, the substrate processing apparatus 20 may include, for example, two or more arithmetic processing parts including an arithmetic processing part (also referred to as a first arithmetic processing part) of one control unit (also referred to as a first control unit) for generating the flow recipe FL1 for a group of substrates W and an arithmetic processing part P25a as a second arithmetic processing part of the partial control unit PC2 as a second control unit for correcting the processing recipe. When such a configuration is adopted, for example, in a case where the first control unit for controlling an operation in a wide range configuration of the substrate processing apparatus 20, which includes a large number of processing units 21, and the second control unit for controlling an operation in a narrow range configuration of the substrate processing apparatus 20, which includes an individual processing unit 21 or part of the processing units 21, are present, when the first arithmetic processing part of the first control unit generates the flow recipe FL1 for a group of substrates W and the second arithmetic processing part of the second control unit corrects the processing recipes in the flow recipe FL1, a hierarchical control over the operations can be easily achieved in the substrate processing apparatus 20. As a result, for example, it is possible to efficiently perform collective generation of the flow recipes FL1 for the group of substrates W and correction of the processing recipes for part of the group of substrates W in almost real time. It is thereby possible, for example, to efficiently perform a substrate processing with high accuracy according to the situation.

In the above-described embodiments, for example, the generation of the flow recipe FL1 and the correction of the processing recipes may be performed by one arithmetic processing part of one control unit. In other words, the generation of the flow recipe FL1 and the correction of the processing recipes may be performed by one or more arithmetic processing parts of one or more control units. In this case, for example, the function of the arithmetic processing part P05a of the main body control unit PC0 relating to the generation of the flow recipe FL1 and the functions of the arithmetic processing parts P25a of the plurality of partial control units PC2 relating to the correction of the processing recipes may be allocated as appropriate to one or more arithmetic processing parts of one or more control units.

In the above-described embodiments, the substrate processing apparatus 20 may include one or more processing units 21, instead of including the plurality of processing units 21.

It goes without saying that all or part of each of the above-described embodiments and various variations can be combined as appropriate within a consistent range.

EXPLANATION OF REFERENCE SIGNS

1: substrate processing system
10: management apparatus
11, P01, P11, P21, P31: communication part
14, P04, P14, P24, P34: storage part
15a, P05a, P15a, P25a, P35a: arithmetic processing part
20: substrate processing apparatus
21: processing unit
22s, 23s, 214: sensor part
23: liquid storage unit
23t: storage tank
24: transfer unit
C31: first correction formula
C31a to C31f: first A to first F correction formulas
C32: second correction formula C32a to C32f: second A to second F correction formulas
C4: branch processing recipe
C4a to C4f: first to sixth branch processing recipes
DG1, Db0: data group
F01, F22, F31: information acquisition part
F02: generation part
F03, F24, F152: storage control part
F04: instruction part
F06, F13, F26, F34, F151: transmission control part
F11: acquisition part
F12: setting part
F21: recipe acquisition part
F23: recipe correction part
F25, F32: unit control part
F33: liquid management part
FL1: flow recipe
Fm0: film thickness meter
Gp1: liquid processing recipe group
Gp2: measurement processing recipe group
Gp3: correction formula group
Gp31, Gp32: first and second correction formula groups
Gp4: branch processing recipe group
L1: processing liquid
L11 to L13: first to third processing liquids
NA1: data storage
PC0: main body control unit
PC1: schedule management control unit
PC2: partial control unit
PC3: liquid management control unit
R1: liquid processing recipe
R1a to R1f: first to sixth liquid processing recipes
R2: measurement processing recipe
R2a to R2f: first to sixth measurement processing recipes
W: substrate

The invention claimed is:

1. A substrate processing apparatus comprising:
one or more processing units each for performing a processing on a substrate;
one or more arithmetic processing parts for generating a flow recipe defining a flow of a series of processings for a substrate by receiving two or more pieces of identifying information identifying two or more processing recipes respectively from a management apparatus connected to said substrate processing apparatus so as to be capable of transmitting and receiving data, and based on said two or more pieces of identifying information, combining said two or more processing recipes among a plurality of processing recipes each defining a processing condition relating to a processing to be performed on a substrate in said one or more processing units; and
one or more sensor parts each for acquiring a signal relating to an index on a state of a substrate processing in said one or more processing units,
wherein
said plurality of processing recipes include a plurality of liquid processing recipes each defining a condition of a processing to be performed on a substrate by using a processing liquid,
said plurality of processing recipes include a plurality of measurement processing recipes each defining a condition of a measurement processing performed by said one or more sensor parts for acquiring said signal relating to said index, and
said one or more arithmetic processing parts generate said flow recipe by combining one or more liquid processing recipes among said plurality of liquid processing recipes and one or more measurement processing recipes among said plurality of measurement processing recipes.

2. The substrate processing apparatus according to claim 1, wherein
said one or more arithmetic processing parts generate said flow recipe by combining one or more processing recipes among said two or more processing recipes with one or more correction formulas among a plurality of correction formulas for correcting at least part of conditions of said plurality of processing recipes on the basis of said signal relating to said index acquired by said one or more sensor parts, and
said one or more arithmetic processing parts calculate one or more correction coefficients from said one or more correction formulas in response to said signal relating to said index acquired by said one or more sensor parts and correct a condition defined by said one or more processing recipes with said one or more correction coefficients.

3. The substrate processing apparatus according to claim 1, wherein
said one or more sensor parts acquires a signal relating to one or more of indices indicating a state of a substrate,
said plurality of processing recipes include a first processing recipe and a second processing recipe,
said plurality of measurement processing recipes include a first measurement processing recipe defining a condition of a measurement processing performed by said one or more sensor parts for acquiring said signal relating to said one or more of indices, and
said one or more arithmetic processing parts generate said flow recipe by combining said first measurement processing recipe and one branch processing recipe, among a plurality of branch processing recipes each for branching a processing flow, which defines a condition of a branch processing for causing a first after-branch processing flow to be performed when said one or more of indices satisfy a first condition and causing a second after-branch processing flow to be performed when said one or more of indices satisfy a second condition while combining said one branch processing recipe with said first processing recipe as a processing recipe of said first after-branch processing flow and combining said one branch processing recipe with said second processing recipe as a processing recipe of said second after-branch processing flow.

4. The substrate processing apparatus according to claim 1, wherein
said plurality of liquid processing recipes include one or more structured liquid processing recipes which each define a processing flow and a condition, in which if it is in a first state while a processing using a first processing liquid is performed on a substrate, a processing using a second processing liquid is performed on the substrate after said processing using said first processing liquid, or in response to the change of the first state to a second state, which is made while said processing using said first processing liquid is performed on the substrate, a processing using a third processing liquid is performed on the substrate.

5. A substrate processing method using a substrate processing apparatus which comprises one or more processing units each performing a processing on a substrate and one or more arithmetic processing parts, comprising the steps of:
(a) in which one or more storage parts store a plurality of processing recipes each defining a processing condition relating to a processing to be performed on a substrate in said one or more processing units;

(b) in which said one or more arithmetic processing parts receive two or more pieces of identifying information identifying two or more processing recipes respectively from a management apparatus connected to said substrate processing apparatus so as to be capable of transmitting and receiving data, and based on said two or more pieces of identifying information, generate a flow recipe defining a flow of a series of processings for a substrate by combining said two or more processing recipes among said plurality of processing recipes stored in said one or more storage parts in said step (a);

(c) in which said one or more processing units perform a processing in accordance with said flow recipe generated in said step (b), wherein said plurality of processing recipes include a plurality of liquid processing recipes each defining a condition of a processing to be performed on a substrate by using a processing liquid, said plurality of processing recipes include a plurality of measurement processing recipes each defining a condition of a measurement processing performed by one or more sensor parts each for acquiring a signal relating to an index on a state of a substrate processing in said one or more processing units, and in said step (b), said one or more arithmetic processing parts generate said flow recipe by combining one or more liquid processing recipes among said plurality of liquid processing recipes and one or more measurement processing recipes among said plurality of measurement processing recipes.

6. The substrate processing method according to claim 5, wherein in said step (b), said one or more arithmetic processing parts generate said flow recipe by combining one or more processing recipes among said two or more processing recipes with one or more correction formulas among a plurality of correction formulas for correcting at least part of conditions of said plurality of processing recipes on the basis of said signal relating to said index acquired by said one or more sensor parts, and the substrate processing method further comprising (d) a step in which said one or more arithmetic processing parts calculate one or more correction coefficients from said one or more correction formulas in response to said signal relating to said index acquired by said one or more sensor parts and correct a condition defined by said one or more processing recipes with said one or more correction coefficients.

* * * * *